United States Patent
Kawaguchi et al.

(10) Patent No.: US 9,553,224 B2
(45) Date of Patent: Jan. 24, 2017

(54) SEMICONDUCTOR PHOTODETECTOR ELEMENT AND METHOD

(71) Applicant: FUJITSU LIMITED, Kawasaki-shi, Kanagawa (JP)

(72) Inventors: Kenichi Kawaguchi, Ebina (JP); Nami Yasuoka, Kawasaki (JP); Hiroyasu Yamashita, Isehara (JP); Yoshiaki Nakata, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/657,328

(22) Filed: Mar. 13, 2015

(65) Prior Publication Data

US 2015/0187972 A1    Jul. 2, 2015

Related U.S. Application Data

(63) Continuation of application No. PCT/JP2012/073804, filed on Sep. 18, 2012.

(51) Int. Cl.
*H01L 31/0352* (2006.01)
*H01L 31/0232* (2014.01)
(Continued)

(52) U.S. Cl.
CPC ......... *H01L 31/03529* (2013.01); *B82Y 20/00* (2013.01); *H01L 31/02327* (2013.01); *H01L 31/035209* (2013.01); *H01L 31/035236* (2013.01); *H01L 31/035281* (2013.01); *H01L 31/075* (2013.01); *H01L 31/105* (2013.01); *H01L 31/107* (2013.01); *H01L 31/18* (2013.01);
(Continued)

(58) Field of Classification Search
CPC .. H01L 31/18; H01L 31/105; H01L 31/03529; H01L 31/035209
USPC .............................................. 257/14; 438/87
See application file for complete search history.

(56) References Cited

U.S. PATENT DOCUMENTS

2004/0089876 A1*  5/2004  Kuwatsuka ......... H01L 31/1075
                                                      257/186
2005/0133723 A1*  6/2005  Lee ................... H01L 21/02381
                                                      250/338.4
(Continued)

FOREIGN PATENT DOCUMENTS

JP     H05-267708     10/1993
JP     H09-283786     10/1997
(Continued)

OTHER PUBLICATIONS

Il-Sug Chung, et al.; "Silicon-photonics light source realized by III-V/Si-grating-mirror laser;" Applied Physics Letters 97; 2010; pp. 151113-1-151113-3 (3 Sheets).
(Continued)

*Primary Examiner* — Christine Enad
(74) *Attorney, Agent, or Firm* — Kratz, Quintos & Hanson, LLP

(57) ABSTRACT

A semiconductor photodetector element includes a semiconductor substrate having a first conductivity type; a columnar structure formed on a first surface of the semiconductor substrate, the columnar structure being composed of a semiconductor of the first conductivity type; a light absorption layer formed so as to surround the columnar structure; and a semiconductor layer formed so as to surround the light absorption layer.

11 Claims, 23 Drawing Sheets

(51) Int. Cl.
- *H01L 31/18* (2006.01)
- *H01L 31/075* (2012.01)
- *H01L 31/107* (2006.01)
- *B82Y 20/00* (2011.01)
- *H01L 31/105* (2006.01)

(52) U.S. Cl.
CPC ............ *H01L 31/184* (2013.01); *Y02E 10/544* (2013.01); *Y02E 10/548* (2013.01); *Y02P 70/521* (2015.11)

(56) References Cited

U.S. PATENT DOCUMENTS

| | | | |
|---|---|---|---|
| 2006/0273421 A1 | 12/2006 | Yasuoka | |
| 2007/0057248 A1 | 3/2007 | Yao | |
| 2007/0108484 A1 | 5/2007 | Nagamune | |
| 2010/0085512 A1* | 4/2010 | Ueda | G02F 1/133609 349/68 |
| 2011/0126891 A1* | 6/2011 | Goto | B82Y 20/00 136/255 |
| 2011/0180894 A1 | 7/2011 | Samuelson | |
| 2012/0134618 A1* | 5/2012 | Carroll | B82Y 10/00 385/2 |
| 2013/0112236 A1* | 5/2013 | Bhan | H01L 31/035281 136/246 |
| 2013/0221385 A1* | 8/2013 | Shibata | H01L 33/64 257/88 |

FOREIGN PATENT DOCUMENTS

| | | |
|---|---|---|
| JP | 2005-217188 A1 | 8/2005 |
| JP | 2005-276969 A1 | 10/2005 |
| JP | 2006-303508 A1 | 11/2006 |
| JP | 2006-339413 A1 | 12/2006 |
| JP | 2007-94193 A1 | 4/2007 |
| JP | 2009-49282 A1 | 3/2009 |
| JP | 2011-124450 A1 | 6/2011 |
| JP | 2011-135058 A1 | 7/2011 |
| JP | 2012-502466 A1 | 1/2012 |
| JP | 2012-64772 A1 | 3/2012 |
| WO | WO 2005/008787 | 1/2005 |

OTHER PUBLICATIONS

International Search Report for International Application No. PCT/JP2012/073804 dated Oct. 30, 2012.

Written Opinion of the International Searching Authority for International Application No. PCT/JP2012/073804 dated Oct. 30, 2012 (7 Sheets, including 3 Sheets translation).

Office Action mailed on Sep. 1, 2015 issued with respect to the corresponding Japanese Patent Application No. 2014-536426; partial translation of office action.

Office Action mailed on Mar. 29, 2016 issued with respect to the corresponding Japanese Patent Application No. 2014-536426, with partially translated office action.

* cited by examiner

APD LENGTH

US 9,553,224 B2

SEMICONDUCTOR PHOTODETECTOR ELEMENT AND METHOD

CROSS-REFERENCE TO RELATED APPLICATIONS

This application is a continuation application of International Application PCT/JP2012/073804 filed on Sep. 18, 2012 and designates the U.S., the entire contents of which are incorporated herein by reference.

FIELD

The embodiments discussed herein relate to a semiconductor photodetector element and a method of fabricating the semiconductor photodetector element.

BACKGROUND

Demand for compact and high performance semiconductor photodetector elements continues to increase for the purpose of downsizing and high density integration of imaging arrays. As a semiconductor photodetector element, a semiconductor surface-photodetector element is generally known. Such a semiconductor photodetector element includes a light absorption layer and a conductive layer stacked in layers in a plane of a substrate to receive light incident perpendicular to a film surface.

RELATED ART DOCUMENT

Patent Documents

Patent Document 1: Japanese Laid-open Patent Publication No. 9-283786
Patent Document 2: Japanese Laid-open Patent Publication No. 2006-303508
Patent Document 3: Japanese Laid-open Patent Publication No. 2006-339413
Patent Document 4: Japanese Laid-open Patent Publication No. 2011-124450
Patent Document 5: International Publication Pamphlet No. WO 2005/008787

SUMMARY

According to an aspect of the embodiment, there is provided a semiconductor photodetector element that includes a semiconductor substrate having a first conductivity type; a columnar structure composed of a semiconductor of the first conductivity type, the columnar structure being formed on a first surface of the semiconductor substrate; a light absorption layer formed so as to surround the columnar structure; and a semiconductor layer formed so as to surround the light absorption layer.

According to another aspect of the embodiment, there is provided a method of fabricating a semiconductor photodetector element. The method includes forming a columnar structure on a semiconductor substrate having a first conductivity type, the columnar structure being composed of a semiconductor of the first conductivity type; forming a light absorption layer so as to surround the columnar structure; and forming a semiconductor layer so as to surround the light absorption layer.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

DESCRIPTION OF EMBODIMENTS

In the related art plane type semiconductor photodetector elements, the thickness of the light absorption layer for forming multiple layers to draw carriers by effectively applying electric fields is restricted. Hence, light reception sensitivity may be lowered when the in-plane size is reduced. Accordingly, it may be preferable to provide a photodetector element without degradation of light reception sensitivity and capable of being reduced in size, and it may also be preferable to provide a method of fabricating such a photodetector element.

First Embodiment

In the following, a description is given, with reference to FIGS. 1A to 9C, of a semiconductor photodetector element according to a first embodiment, and a method of fabricating such a semiconductor photodetector element.

Figure 1A:
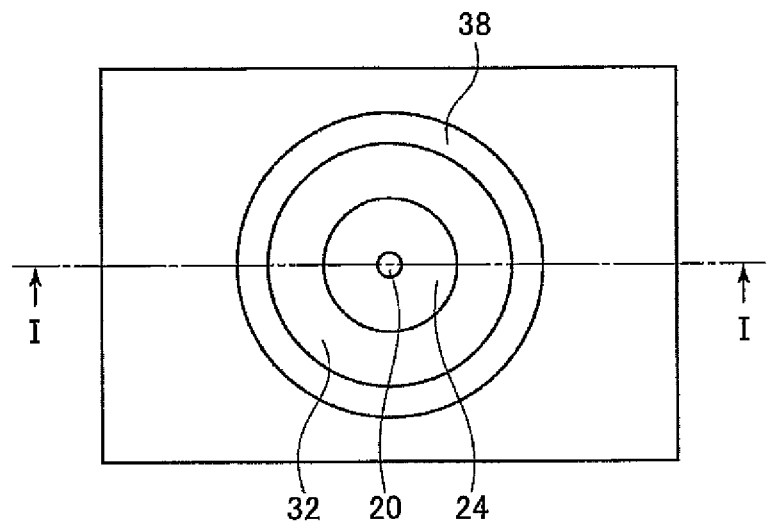
FIGS. 1A and 1B are a plan view and a schematic cross-sectional view illustrating a structure of a semiconductor photodetector element according to a first embodiment.
Figure 1B:
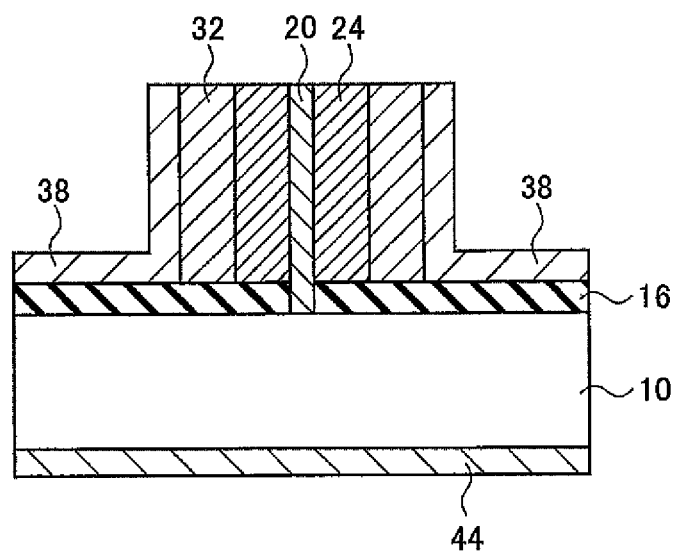
Figure 2:
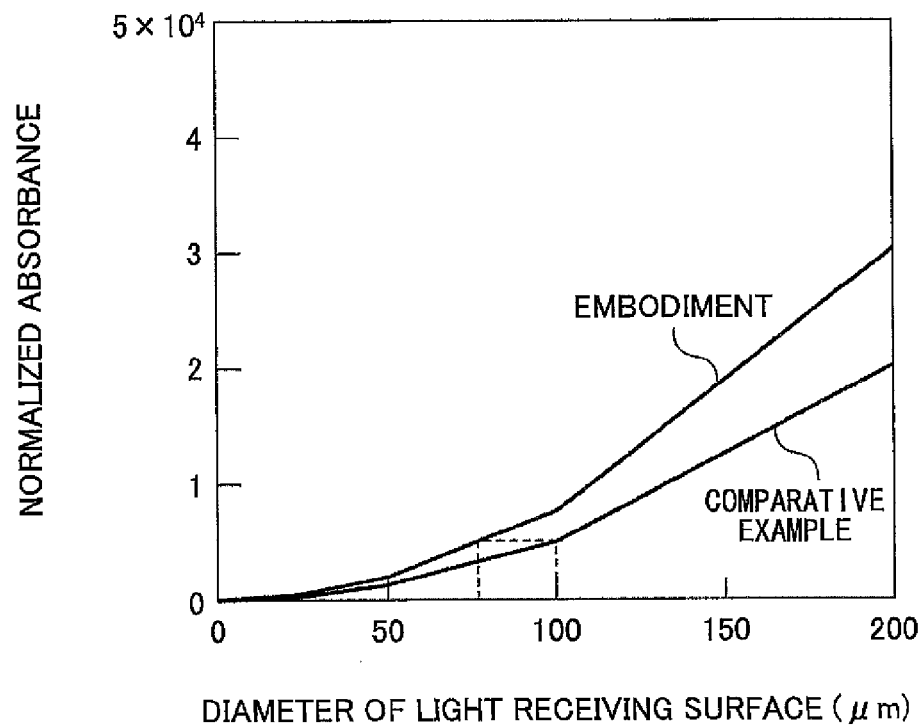
FIG. 2 is a graph illustrating a relationship between a diameter of a light receiving surface of the semiconductor photodetector element and normalized absorbance.
Figure 3:
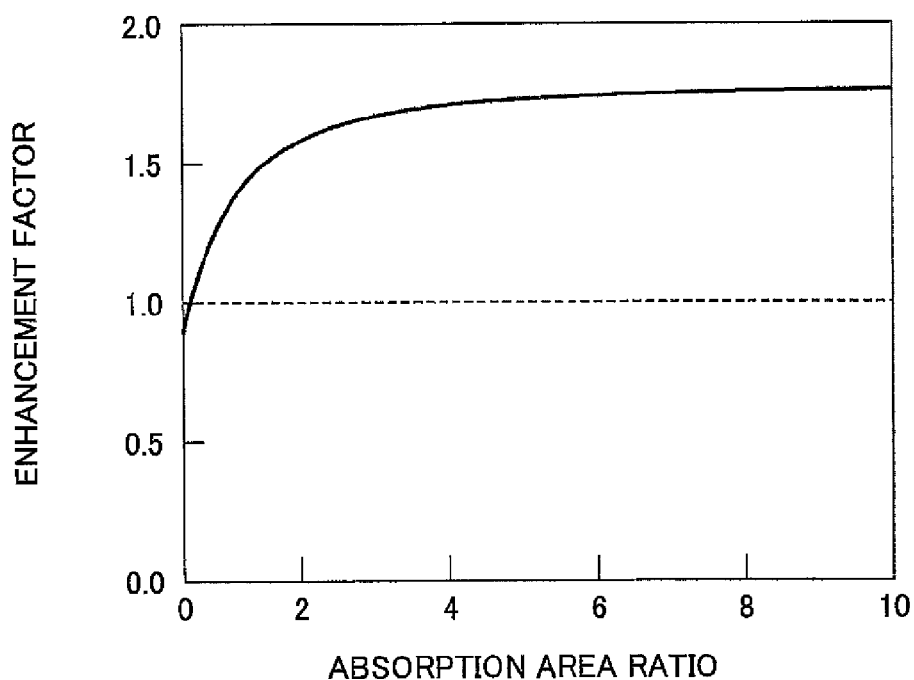
FIG. 3 is a graph illustrating a relationship between an absorption area ratio of a light absorption layer with respect to a columnar structure and an enhancement factor.
Figure 4:
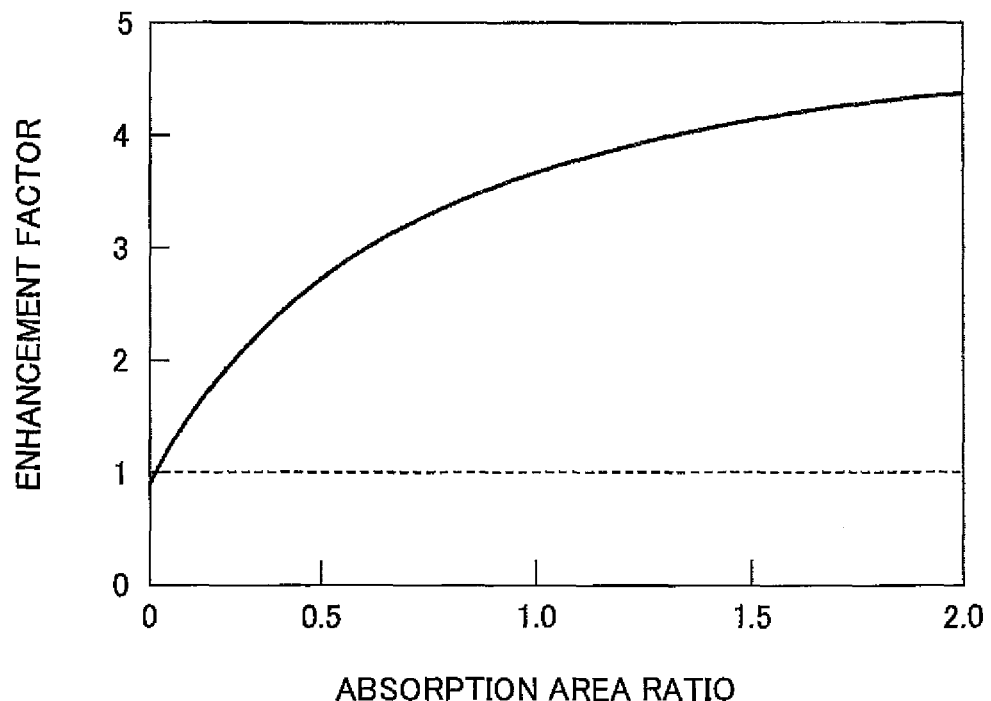
FIG. 4 is a graph illustrating a relationship between an absorption area ratio of a light absorption layer with respect to a columnar structure and an enhancement factor.
Figure 5:
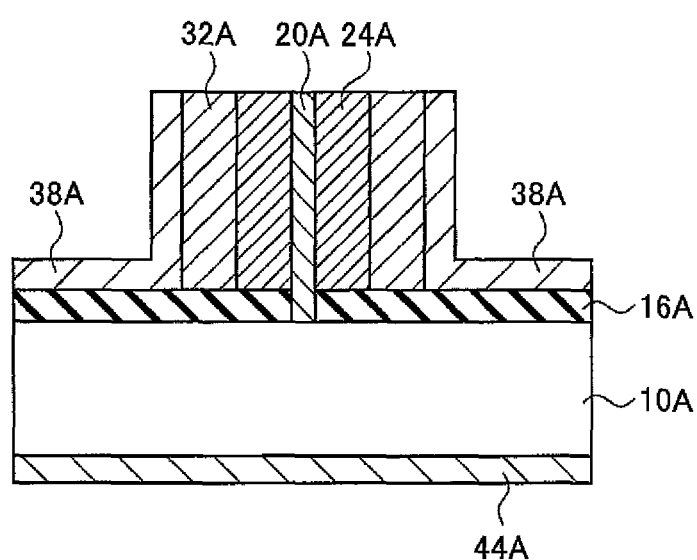
FIG. 5 is a schematic cross-sectional view illustrating an example of a specific structure of the semiconductor photodetector element according to the first embodiment.
Figure 6:
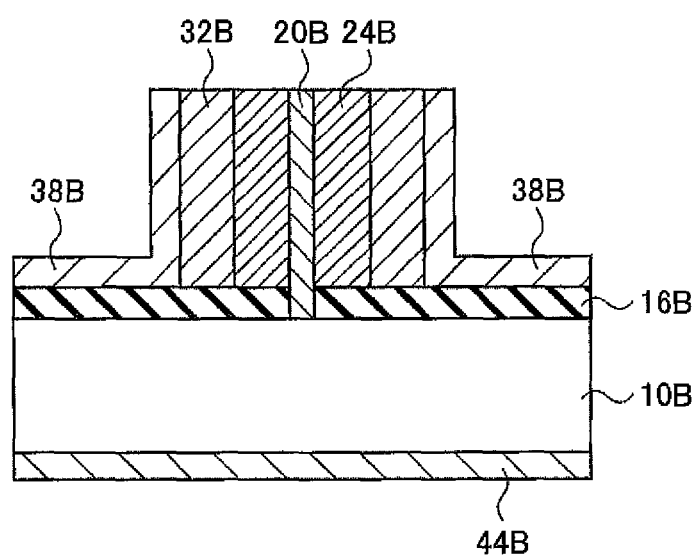
FIG. 6 is a schematic cross-sectional view illustrating an example of a specific structure of the semiconductor photodetector element according to the first embodiment.

FIGS. 1A and 1B are a plan view and a schematic cross-sectional view illustrating a structure of a semiconductor photodetector element according to the first embodiment. FIG. 2 is a graph illustrating a relationship between a diameter of a light receiving surface of the semiconductor photodetector element and normalized absorbance. FIGS. 3 and 4 are graphs illustrating a relationship between an absorption area ratio of a light absorption layer with respect to a columnar structure and an enhancement factor. FIGS. 5 and 6 are schematic cross-sectional views illustrating an example of a specific structure of the semiconductor photodetector element according to the first embodiment. FIGS. 7A to 9C are process cross-sectional views illustrating a method of fabricating the semiconductor photodetector element according to the first embodiment.

Initially, a description is given of a structure of the semiconductor photodetector element according to the first embodiment with reference to FIGS. 1A and 1B. FIG. 1A is a plan view of the semiconductor photodetector element according to the first embodiments, FIG. 1B is a cross-sectional view cut along a line I-I' of FIG. 1A.

A columnar structure 20 composed of a first conductivity type (p-type or n-type) semiconductor is formed on a first conductivity type semiconductor substrate 10. An insulator film 16 is formed in a part of an area of the semiconductor substrate 10 excluding a part of the area in which the columnar structure 20 is formed. A light absorption layer 24 composed of an i-type semiconductor layer is formed on a side wall part of the columnar structure 20 projecting from the insulating film 16 such that the columnar structure 20 is surrounded by the light absorption layer 24. A second conductivity type (n-type or p-type) semiconductor layer 32 is formed on a side wall part of the light absorption layer 24 such that the light absorption layer 24 is surrounded by the second conductivity type semiconductor layer 32. A second conductivity type electrode 38 is formed on a side wall part of the second conductivity type semiconductor layer 32 such that the second conductivity type semiconductor layer 32 is surrounded by the second conductivity type electrode 38. A first conductivity type electrode 44 is formed on a rear surface of the semiconductor substrate 10.

The semiconductor photodetector element according to the first embodiment is a pin junction type photodiode including the columnar structure 20, the light absorption layer 24, and the second conductivity type semiconductor layer 32 that form a pin junction. The light absorption layer 24 and the second conductivity type semiconductor layer 32 are disposed concentrically in a cylindrical configuration around the columnar structure 20, such that the columnar structure 20 is surrounded by the light absorption layer 24 and the second conductivity type semiconductor layer 32. Hence, the pin junction is also formed in a cylindrical configuration perpendicular to the semiconductor substrate 10.

Light subject to detection is incident from an upper part of the semiconductor substrate 10 (i.e., the upper side in FIG. 1B). Further, an application direction of electric fields applied to the pin junction via the first conductivity type electrode 44 and the second conductivity type electrode 38, namely, a carrier moving direction is a diameter direction of the cylinder forming the pin junction. That is, an incident direction of the light subject to detection and the application direction of the electric fields applied to the pin junction are orthogonal to each other.

Hence, the semiconductor photodetector element according to the first embodiment may be able to control light reception sensitivity in accordance with a thickness (a height) of the light absorption layer 24 along the incident direction of the light subject to detection, and to control high-rate response characteristics based on a thickness (a film thickness) of the light absorption layer 24 along the carrier moving direction. The height and film thickness of the light absorption layer 24 may be controlled independently. Hence, the light reception sensitivity and the high-rate response characteristics of the semiconductor photodetector element according to the first embodiment may be improved simultaneously. A total absorbance A in the light absorption layer may be represented by the following formula (1), where S denotes a surface area of the light absorption layer, t denotes a film thickness of the light absorption layer, and a denotes an optical absorption coefficient.

$$A \propto S \ (1/a)(1-e^{-at}) \quad (1)$$

As a result of examining the semiconductor photodetector element according to the first embodiment based on the relationship in the formula (1), the semiconductor photodetector element according to the first embodiment may be able to reduce the light receiving area without lowering the light absorbance.

FIG. 2 illustrates a calculated result of normalized absorbance (the right side of the formula (1)) with respect to a diameter of a light receiving surface in a case where a light absorption layer having an optical absorption coefficient a being $10^{-4}$ cm$^{-1}$ based on an assumed model of a typical direct transition semiconductor is used. In FIG. 2, a comparative example indicates a plane type semiconductor photodetector element including a light absorption layer having a film thickness of 1 μm, and the first embodiment indicates a semiconductor photodetector element including a photoconductive layer on a side wall part of the columnar structure 20 having a diameter of 100 nm and a length of 3 μm.

As illustrated in FIG. 2, in the semiconductor photodetector element of the first embodiment, the diameter of the light receiving surface for acquiring equivalent light absorbance may be reduced to be less than that of the comparative example semiconductor photodetector element. For example, the diameter of the light receiving surface of the semiconductor photodetector element of the first embodiment may be reduced to 75 μm to implement light absorbance equivalent to the comparative example semiconductor photodetector element having the diameter of the light receiving surface of 100 μm. Accordingly, the semiconductor photodetector element according to the first embodiment may be able to reduce the area of the light receiving surface without decreasing light absorbance.

Further, the semiconductor photodetector element according to the first embodiment may be able to increase light absorbance to be greater than that of the comparative example semiconductor photodetector element in a case where an area S of the light receiving surface of the first embodiment is equal to that of the light receiving surface of the comparative example semiconductor photodetector element.

A ratio R of the light absorbance is represented by the following formula (2), where $r_0$ denotes a radius of the columnar structure 20, h denotes a length (a height) of the columnar structure 20, $r_1$ denotes a radius (an outer radius) of the light absorption layer 24, t denotes a film thickness of the light absorption layer 24, and a denotes an optical absorption coefficient of the light absorption layer 24.

$$R=\{1-r_0^2/r_1^2)((1-e^{-ah})/e^{-at}) \quad (2)$$

FIG. 3 illustrates a calculated result of an enhanced factor for the absorption area ratio of the light receiving layer 24 with respect to columnar structure 20 in a case where a light absorption layer having an absorption coefficient a being $10^{-4}$ cm$^{-1}$ based on the assumed model of the typical direct transition semiconductor is used. The calculated example in FIG. 3 is obtained as a result of comparison with a (comparative example) plane type semiconductor photodetector element having a light receiving layer having a film thickness of 0.8 μm, and the calculation is performed based on the length of the columnar structure being 4 μm.

The enhancement factor being greater than 1 indicates the light absorbance being greater than that of the comparative example semiconductor photodetector element. In the example of FIG. 3, the semiconductor photodetector element of the first embodiment may be able to increase the light absorbance by approximately up to 75% greater than that of the comparative example semiconductor photodetector element.

Further, as a result of examining the semiconductor photodetector element according to the first embodiment, the semiconductor photodetector element according to the first embodiment may be able to specifically exhibit an excellent effect when the semiconductor photodetector element having the light absorption layer composed of an indirect transition semiconductor (e.g., SiGe type photodetector element) is used in a wavelength range of an indirect transition area, for example.

FIG. 4 illustrates a calculated result of an enhanced factor for the absorption area ratio of the light receiving layer 24 with respect to columnar structure 20 in a case where a light absorption layer having an absorption coefficient a being $10^{-2}$ cm$^{-1}$ composed of the assumed model of the indirect transition semiconductor is used. The calculated example in FIG. 4 is obtained as a result of comparison with a (comparative example) plane type semiconductor photodetector element including a light receiving layer having a film thickness of 0.8 μm, and the calculation is performed based on the length of the columnar structure being 4 μm.

In the example of FIG. 4, the semiconductor photodetector element of the first embodiment may be able to increase the light absorbance by approximately up to 400% greater than that of the comparative example semiconductor photodetector element.

Note that the columnar structure 20 does not contribute to light absorption. Hence, a satisfactory effect may be obtained when a surface area of the light absorption layer 24 is increased at a certain value or more with respect to a surface area of the columnar structure 20. The semiconductor photodetector element of the first embodiment may be able to provide a boundary of the certain value as being approximately represented by the following formula (3).

$$r_1/r_0 > \exp(a/2 \times 10^4) \quad (3)$$

The semiconductor photodetector element of the first embodiment may be able to provide the following secondary effects. First, the semiconductor photodetector element of the first embodiment may be able to exhibit a high rate response because the light absorption layer 24 viewed in a pn junction direction is thin. Second, the semiconductor photodetector element of the first embodiment may be able to operate with a low reverse bias because the light absorption layer 24 viewed in the pn junction direction is thin. As a level of the effect, a bias necessary for applying the same electric fields is in proportion to a thickness of a film. Hence, it may be possible to halve the bias applied when the film thickness in a radial direction of the semiconductor photodetector element of the first embodiment is reduced to ½ of the related art film thickness. Third, the semiconductor photodetector element of the first embodiment may be able to suppress current leakage because the pn junction is cylindrically formed. FIGS. 5 and 6 are views illustrating specific structural examples of the semiconductor photodetector element according to the first embodiment. FIG. 5 is an example of the semiconductor photodetector element of the first embodiment including the light absorption layer 24 composed of an i-InGaAs layer.

An n-InP columnar structure 20A is formed on an n-InP substrate 10A. A silicon oxide film 16A is formed on the n-InP substrate 10A excluding an area in which the n-InP columnar structure 20A is formed. An i-InGaAs light absorption layer 24A is formed on a side wall part of the n-InP columnar structure 20A that projects from a surface of an insulating film 16A. A p-InP layer 32A is formed on a side wall part of the i-InGaAs light absorption layer 24A. A p-type electrode 38A is formed on a side wall part of the p-InP layer 32A. An n-type electrode 44A is formed on a rear surface of the n-InP substrate 10A. FIG. 6 is an example of the semiconductor photodetector element of the first embodiment including the light absorption layer 24 composed of an i-SiGe layer.

An n-Si columnar structure 20B is formed on an n-Si substrate 10B. A silicon oxide film 16B is formed on the n-Si substrate 10B excluding an area in which the n-Si columnar structure 20B is formed. An i-SiGe light absorption layer 243 is formed on a side wall part of the n-Si columnar structure 20B that projects from a surface of an insulating film 16B. A p-Si layer 32B is formed on a side wall part of the i-SiGe light absorption layer 24B. A p-type electrode 38B is formed on a side wall part of the p-Si layer 32B. An n-type electrode 44B is formed on a rear surface of the n-Si substrate 10B.

Note that materials forming the semiconductor photodetector element according to the first embodiment are not limited to those illustrated in FIGS. 5 and 6, and various combinations of materials for forming a pin junction photodiode may be appropriately selected. Further, a conductivity type of each of the components may be a reverse conductivity type. Further, a cross-sectional shape of the columnar structure 20 is not necessarily a circular shape. For example, the cross-sectional shape of the columnar structure 20 may be polygonal such as triangular or hexagonal, or may be oval.

Next, a description is given, with reference to FIGS. 7A to 9C, of a method of fabricating a semiconductor photodetector element according to the first embodiment. In the first embodiment, the fabrication method is described on the basis of the example of the semiconductor photodetector element illustrated in FIG. 5. However, semiconductor photodetector elements composed of other materials may also be fabricated by similar methods.

Initially, a silicon oxide film 16A serving as a mask is formed by a CVD method on the n-InP substrate 10A having an impurity concentration range of, for example, $5 \times 10^{17}$ $cm^{-3}$ to $1 \times 10^{19}$ $cm^{-3}$.

Figure 7A:
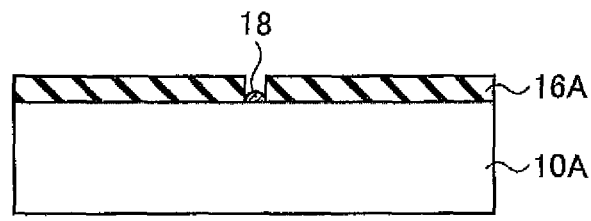
FIGS. 7A to 7C are process cross-sectional views illustrating a method of fabricating the semiconductor photodetector element according to the first embodiment.

Subsequently, the silicon oxide film 16A in an expected n-InP columnar structure 20A forming area is removed, and metallic microparticles 18 such as Au microparticles are deposited on a surface of the n-InP substrate 10A exposed by the removal of the silicon oxide film 16A (FIG. 7A).

For example, after a not-illustrated photoresist film, from which the expected n-InP columnar structure 20A forming area is to be exposed, is formed on the silicon oxide film 16A, the silicon oxide film 16A in the n-InP columnar structure 20A forming area is removed by using the photoresist film as a mask. After the metallic microparticles 18 are deposited, the photoresist film is removed so as to cause the deposited metallic microparticles 18 to selectively remain in the expected n-InP columnar structure 20A forming area.

Figure 7B:
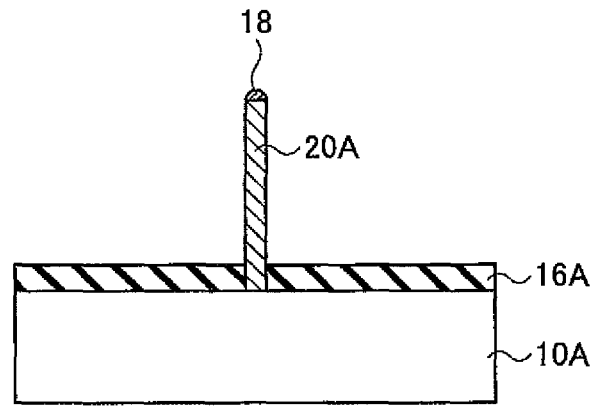

Subsequently, an n-InP columnar structure 20A having, for example, a radius of 100 nm and a length of 4 µm is formed in an area not covered with the silicon oxide film 16A of the n-InP substrate 10A, for example, by a MOVPE method (FIG. 7B). Examples of raw materials for the InP are, but not specifically limited to, trimethylindium (TMIn), and phosphine ($PH_3$). In a case where sulfur (S) is used as an n-type dopant, hydrogen sulfide ($H_2S$) is used as a raw material, for example. The impurity concentration may, for example, be in a range from $5 \times 10^{17}$ $cm^{-3}$ to $1 \times 10^{19}$ $cm^{-3}$. A growth temperature may, for example, be in a range from 380 to 400° C., and a V/III ratio (a flow ratio of $PH_3$ and TMI) may, for example, be in a range from 100 to 500. Subsequently, the metallic microparticles 18 remaining in an apex part of the expected n-InP columnar structure 20A forming area are removed by generally-known etching technology.

Subsequently, an i-InGaAs light absorption layer 24A having, for example, a thickness of approximately 40 nm is formed on a side part of the n-InP columnar structure 20A by, for example, the MOVPE method. Examples of raw materials for the InGaAs are, but not specifically limited to, TMIn, triethylgallium (TEGa), and arsine ($ASH_3$).

The n-InP columnar structure 20A having a radius ($r_0$) of 100 nm, and the i-InGa light absorption layer 24A having a radius ($r_1$) of 500 nm are thus formed. Note that when the above-described relationship is applied to the formula (3), the following relationship is established.

$r_1/r_0 = 500/100 = 5 > \exp(10^4/2 \times 10^4)$

Hence, the above relationship applied to the formula (3) is thus satisfied.

Figure 7C:
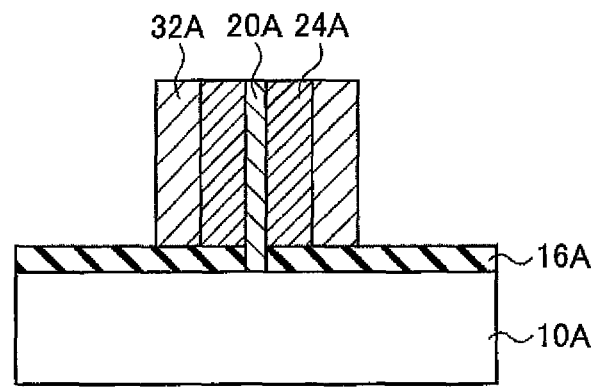

Subsequently, a p-InP layer 32A is formed by, for example, the MOVPE method on the side part of the n-InP columnar structure 20A where the i-InGaAs light absorption layer 24A is formed (FIG. 7C). Examples of raw materials for the InP are, but not specifically limited to, TMIn, and $PH_3$. In a case where zinc (Zn) is used as a p-type dopant, diethylzinc (DEZn) is used as a raw material, for example. The impurity concentration may, for example, be in a range from $5 \times 10^{17}$ $cm^{-3}$ to $1 \times 10^{19}$ $cm^{-3}$.

Note that the i-InGaAs light absorption layer 24A and the p-InP layer 32A may selectively be formed on the side part of the n-InP columnar structure 20A by appropriately controlling a growth condition, and may be formed such that an upper end part of the n-InP columnar structure 20A is also covered.

For example, a growth temperature range may be 530 to 580° C. InGaAs is grown based on a V/III ratio (i.e., a flow ratio of $AsH_3$ and TMI+TEG) ranging from 300 to 1000, and InP is grown based on a V/III ratio (i.e., a flow ratio of $PH_3$ and TMI) ranging from 1000 to 2000. Accordingly, the i-InGaAs light absorption layer 24A and the p-InP layer 32A may selectively be grown on the side part of the n-InP columnar structure 20A. That is, the i-InGaAs light absorption layer 24A and the p-InP layer 32A may be grown in a radial direction of the n-InP columnar structure 20A.

Alternatively, a growth temperature range may be adjusted in a range of 450 to 500° C. InGaAs may be grown based on a V/III ratio (i.e., a flow ratio of $AsH_3$ and TMI+TEG) ranging from 20 to 60, and InP may be grown based on a V/III ratio (i.e., a flow ratio of $PH_3$ and TMI) ranging from 100 to 300. Accordingly, the i-InGaAs light absorption layer 24A and the p-InP layer 32A may be formed such that the upper end part of the n-InP columnar structure 20A is also covered.

In the example illustrated in FIG. 7, the i-InGaAs light absorption layer 24A and the p-InP layer 32A are selectively formed on the side part of the n-In columnar structure 20A. However, the i-InGaAs light absorption layer 24A and the p-InP layer 32A may be formed such that the upper end part of the n-In columnar structure 20A is also covered.

Figure 8A:
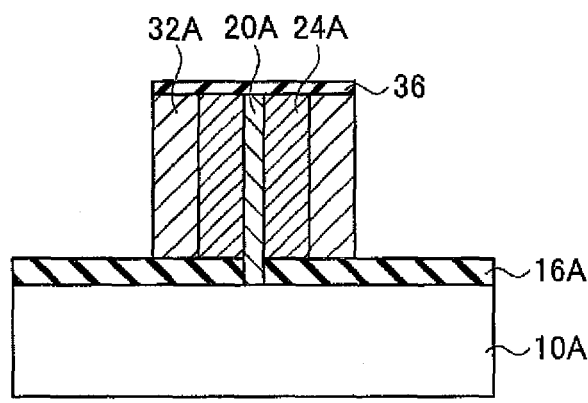
FIGS. 8A to 8C are process cross-sectional views illustrating a method of fabricating the semiconductor photodetector element according to the first embodiment.
Figure 8B:
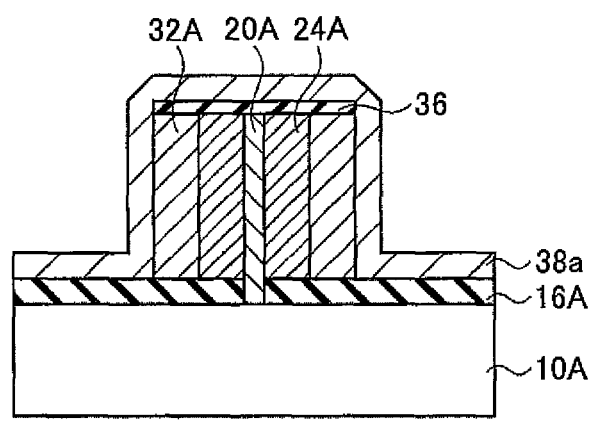

Subsequently, after the silicon oxide film is deposited, for example, by the CVD method, the silicon oxide film is patterned by photolithography and etching. Hence, an insulating film 36 is selectively caused to remain on upper surfaces of the n-InP columnar structure 20A, the i-InGa light absorption layer 24A, and the p-InP layer 32A (FIG. 8A). Subsequently, a metallic film 38a that will serve as a p-type electrode 38A is deposited over an entire surface of the product of FIG. 8A by sputtering (FIG. 8B).

Figure 8C:
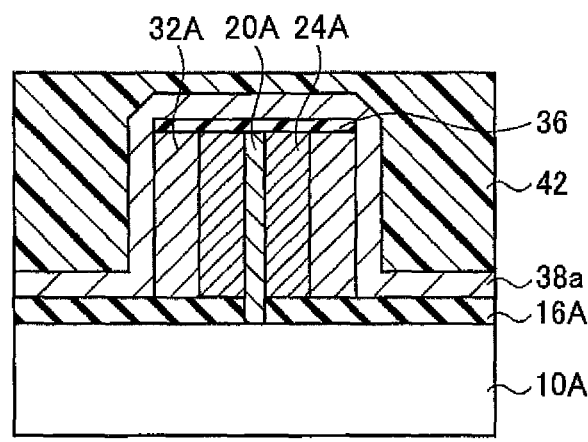

Subsequently, a resist film 42 is deposited over an entire surface of the product of FIG. 8B (FIG. 8C).

Figure 9A:
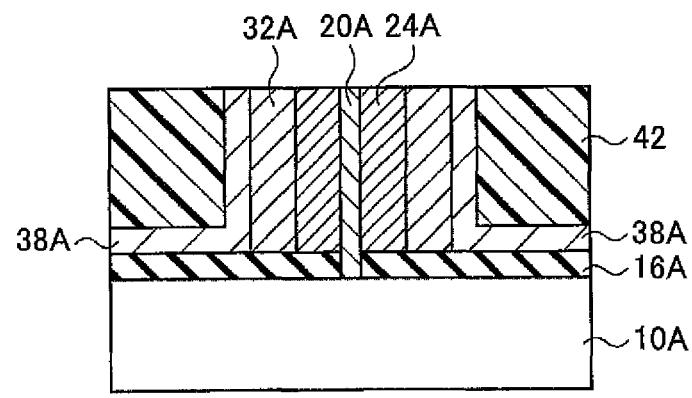
FIGS. 9A to 9C are process cross-sectional views illustrating a method of fabricating the semiconductor photodetector element according to the first embodiment.

Subsequently, the resist film 42, the metallic film 38a, and the insulating film 36 are etched until the upper surface of the n-InP columnar structure 20A is exposed so as to form the p-type electrode 38A (FIG. 9A). Note that the insulating film 36 is not necessarily removed, and may be left on the n-InP columnar structure 20A, the i-InGa light absorption layer 24A, and the p-InP layer 32A.

Figure 9B:
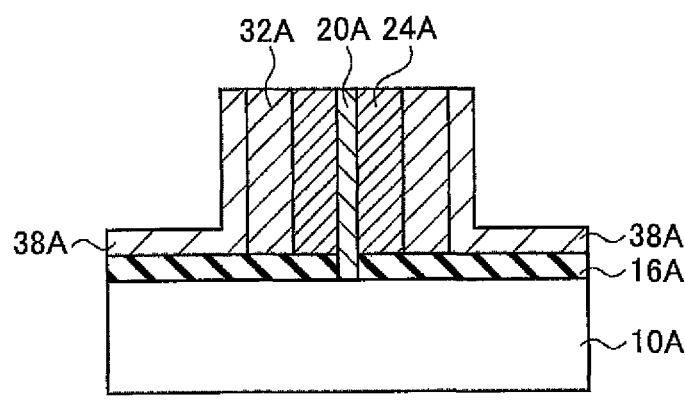
Figure 9C:
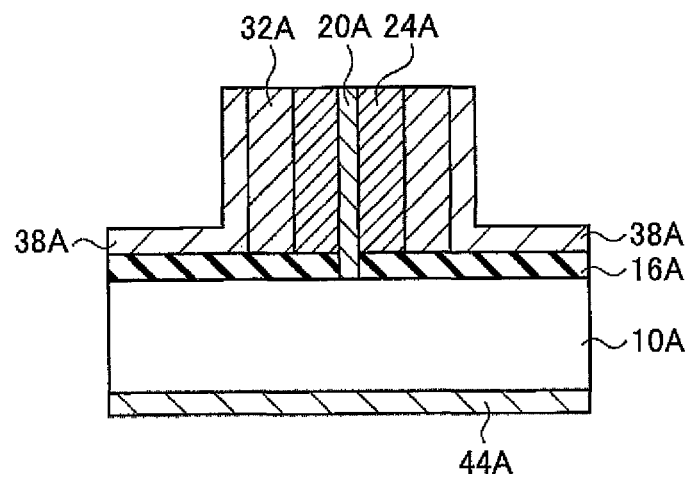

In a case where the i-InGa light absorption layer 24A and the p-InP layer 32A are formed such that the upper end of the n-InP columnar structure 20I is covered, the i-InGa light absorption layer 24A and the p-InP layer 32A on the upper end of the n-InP columnar structure 20A are also removed in this step. Subsequently, the resist film 42 is removed (FIG. 9B). Then, after a rear surface of the n-InP substrate 10A is processed, an n-type electrode is formed on the rear surface of the n-InP substrate 10A, thereby completely forming the semiconductor photodetector element according to the first embodiment (FIG. 9C).

Note that to form the semiconductor photodetector element with the i-SiGe layer illustrated in FIG. 6, disilane ($Si_2H_6$) and germane ($GeH_4$) may be used.

As described above, according to the first embodiment, since the pin structure is formed in a cylindrical shape to surround the columnar structure perpendicular to the semiconductor substrate, light reception sensitivity and high-rate response characteristics may simultaneously be improved. In addition, the photodetector element may be reduced in size.

Second Embodiment

Figure 10:
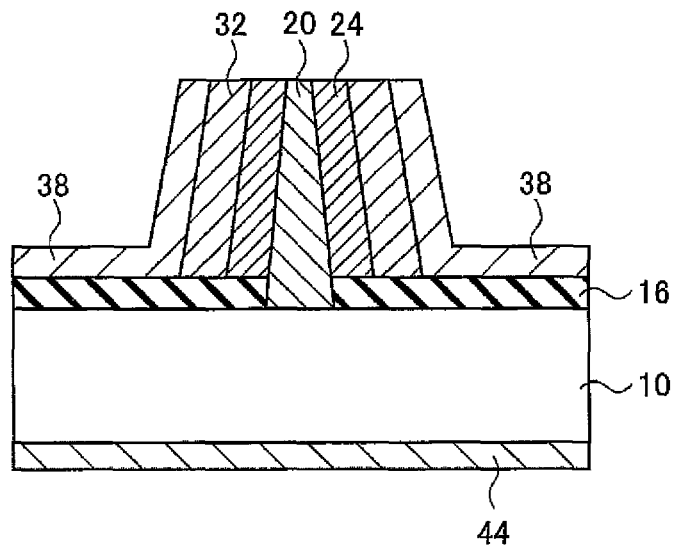
FIG. 10 is a schematic cross-sectional view illustrating a structure of a semiconductor photodetector element according to a second embodiment.

A description is given, with reference to FIG. 10, of a semiconductor photodetector element according to a second embodiment, and a method of fabricating such a semiconductor photodetector element. In FIG. 10, components similar to those of the semiconductor photodetector element according to the first embodiment illustrated in FIGS. 1A to 9C are provided with the same reference numbers to simplify the description by omitting duplicated illustration. FIG. 10 is a schematic cross-sectional view illustrating a structure of a semiconductor photodetector element according to the second embodiment.

The semiconductor photodetector element according to the second embodiment differs from the semiconductor photodetector element according to the first embodiment having the columnar structure 20 of the cylindrical shape in that the columnar structure 20 of the second embodiment has a circular truncated cone shape.

The columnar structure 20 is not necessarily in a cylindrical shape having the radius of the upper end part and the radius of the lower part being the same, and the columnar structure 20 may have the circular truncated cone shape having the radius of the upper end part and the radius of the lower end part being different. The radius of the upper end part may be larger than that of the lower end part in the circular truncated cone shape; however, it may be preferable that the radius of the upper end part be smaller than the radius of the lower end part in view of enlarging a contact area of the semiconductor substrate 10 and the columnar structure 20 to reduce interface resistance.

Further, a cross-sectional shape of the columnar structure 20 is not necessarily a circular shape. For example, the cross-sectional shape of the columnar structure 20 may be polygonal such as triangular and hexagonal, or may be oval. Further, inclination of the side part of the columnar structure 20 is not necessarily constant. A method of fabricating the semiconductor photodetector element according to the second embodiment may be similar to the method of fabricating the semiconductor photodetector element according to the first embodiment except that the growth condition of the columnar structure 20 in the second embodiment differs from that of the columnar structure 20 in the first embodiment.

The columnar structure 20 may be formed in the cylindrical shape as illustrated in the first embodiment, or may be formed in the circular truncated cone shape as illustrated in the second embodiment by appropriately setting a deposition condition.

For example, the n-InP columnar structure 20A having no taper as illustrated in the first embodiment may be formed by appropriately setting the growth temperature range of, for example, 380 to 400° C., and the C/III ratio (the flow ratio of $PH_3$ and TMI), for example, ranging from 100 to 500 as described earlier. In general, when the growth temperature is high, and the V/III ratio is high, the growth may easily be developed in a radial direction from the bottom part of the columnar structure 20 at the time of causing the columnar structure 20 to grow in an axial direction, thereby gradually forming a taper. When the amount of taper is small, a small amount of hydrogen chloride (HCl) may be supplied simultaneously at the growth time of the columnar structure 20 to etch a radial direction component at the axial direction growth of the columnar structure 20, thereby controlling the amount of the taper.

In the meantime, to form the circular truncated cone shaped n-InP columnar structure 20A having a taper as illustrated in the second embodiment, a higher growth temperature, and a higher V/III ratio may be set. For example, the growth temperature may be in a range from 420 to 450° C., and he V/III ratio (a flow ratio of $PH_3$ and TMI) may be in a range from 500 to 1000. Hence, the n-InP columnar structure 20A having the circular truncated cone shape may be formed.

The shape of the columnar structure 20 may be controlled by a similar method in a case where the columnar structure 20 is formed of InP, and further in a case where the columnar structure 20 is formed of other materials.

As described above, according to the second embodiment, since the pin structure is formed in a cylindrical shape to surround the columnar structure perpendicular to the semiconductor substrate, light reception sensitivity and high-rate response characteristics may simultaneously be improved. In addition, the photodetector element may be reduced in size.

Third Embodiment

Figure 11:
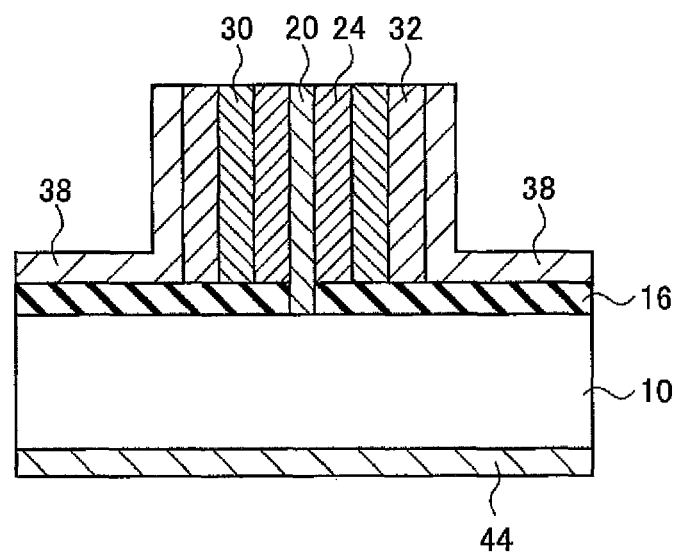
FIG. 11 is a schematic cross-sectional view illustrating a structure of a semiconductor photodetector element according to a third embodiment.

A description is given, with reference to FIG. 11, of a semiconductor photodetector element according to a third embodiment, and a method of fabricating such a semiconductor photodetector element. In FIG. 11, components similar to those of the semiconductor photodetector element according to the first embodiment and the second embodiment illustrated in FIGS. 1A to 10 are provided with the same reference numbers to simplify the description by omitting duplicated illustration. FIG. 11 is a schematic cross-sectional view illustrating a structure of a semiconductor photodetector element according to the third embodiment.

Initially, a description is given of a structure of the semiconductor photodetector element according to the third embodiment with reference to FIG. 11.

A columnar structure 20 composed of p$^+$-InP or the like is formed on a p$^+$-InP or the like semiconductor substrate 10. An insulator film 16 composed of a silicon oxide film or the like is formed in a part of an area of the semiconductor substrate 10 excluding a part of the area in which the columnar structure 20 is formed. A light absorption layer 24 composed of n-InGaAs or the like is formed on a side wall part of the columnar structure 20 projected from the insulating film 16. A carrier multiplication layer 30 composed of n-InP or the like is formed on a side wall part of the light absorption layer 24. A semiconductor layer 32 composed of n$^+$-InP or the like is formed on a side wall part of the carrier multiplication layer 30. A second conductivity (n-type) electrode 38 is formed on a side wall part of the semiconductor layer 32. A first conductivity type (p-type) electrode 44 is formed on a rear surface of the semiconductor substrate 10.

As described above, the semiconductor photodetector element according to the third embodiment further includes the carrier multiplication layer 30 between the light absorption layer 24 and the semiconductor layer 32 of the semiconductor photodetector element according to the first embodiment illustrated in FIGS. 1A and 1B. That is, the semiconductor photodetector element according to the third embodiment is a so-called avalanche photodiode (APD) type photodetector element.

The APD type photodetector element according to the third embodiment may also be able to exhibit advantageous effects such as high-response characteristics, operability with a low voltage, and controllability of current leakage, in a manner similar to the pin type photodetector element as illustrated in the first and the second embodiments.

The method of fabricating the semiconductor photodetector element according to the third embodiment is similar to the method of fabricating the semiconductor photodetector element according to the first embodiment illustrated in FIGS. 7 to 9C, except that the method of fabricating the semiconductor photodetector element according to the third embodiment further includes a forming a carrier multiplication layer 30 step after forming the light absorption layer 24 step and before forming the semiconductor layer 32 step.

As described above, according to the third embodiment, since the APD structure is formed in a cylindrical shape to surround the columnar structure perpendicular to the semiconductor substrate, light reception sensitivity and high-rate response characteristics may simultaneously be improved. In addition, the photodetector element may be reduced in size.

Fourth Embodiment

Figure 12:
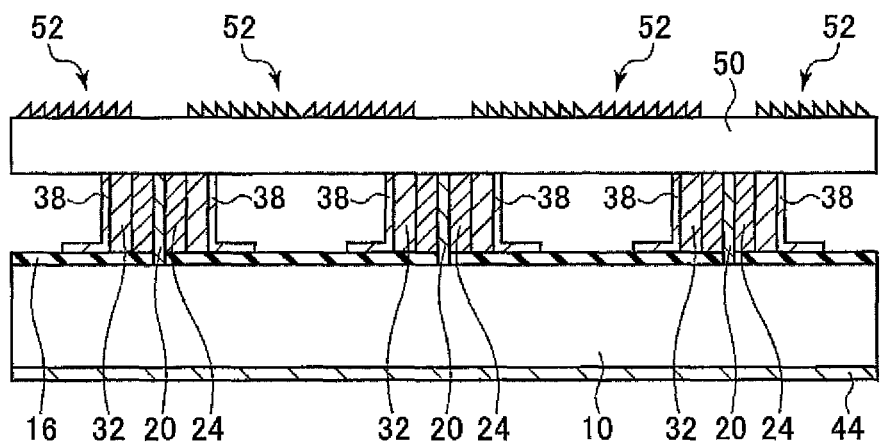
FIG. 12 is a schematic cross-sectional view illustrating a structure of a semiconductor photodetector element according to a fourth embodiment.

A description is given, with reference to FIG. 12, of a semiconductor photodetector element according to a fourth embodiment, and a method of fabricating such a semiconductor photodetector element. In FIG. 12, components similar to those of the semiconductor photodetector element according to the first embodiment to the third embodiment illustrated in FIGS. 1A to 11 are provided with the same reference numbers to simplify the description by omitting duplicated illustration. FIG. 12 is a schematic cross-sectional view illustrating a structure of a semiconductor photodetector element according to the fourth embodiment.

The semiconductor photodetector element according to the fourth embodiment is, as illustrated in FIG. 12, a two-dimensional photodetector element array having two or more photodetector elements according to the first embodiment disposed on one semiconductor substrate 10 in a two-dimensional array configuration. The semiconductor substrate 10, on which two or more photodetector elements are disposed, includes a substrate 50 having a surface on which Fresnel lenses 52 are formed so as to efficiently receive light incident in the photodetector elements.

As described above, the photodetector elements according to the first embodiment have small in-plane surfaces with high light reception sensitivity. Hence, the size of the device may be reduced without degrading the light reception sensitivity by forming the two-dimensional array element using these photodetector elements according to the first embodiment.

Note that FIG. 12 illustrates an example of the two-dimensional photodetector element array that is composed of the photodetector elements according to the first embodiment. However, the two-dimensional photodetector element array may be composed of the photodetector elements according to the second embodiment or the third embodiment.

Fifth Embodiment

A description is given, with reference to FIGS. 13A to 22, of a semiconductor photodetector element according to a fifth embodiment, and a method of fabricating such a semiconductor photodetector element. In FIG. 13A to 22, components similar to those of the semiconductor photodetector element according to the first embodiment to the fourth embodiment illustrated in FIGS. 1A to 12 are provided with the same reference numbers to simplify the description by omitting duplicated illustration.

Figure 13A:
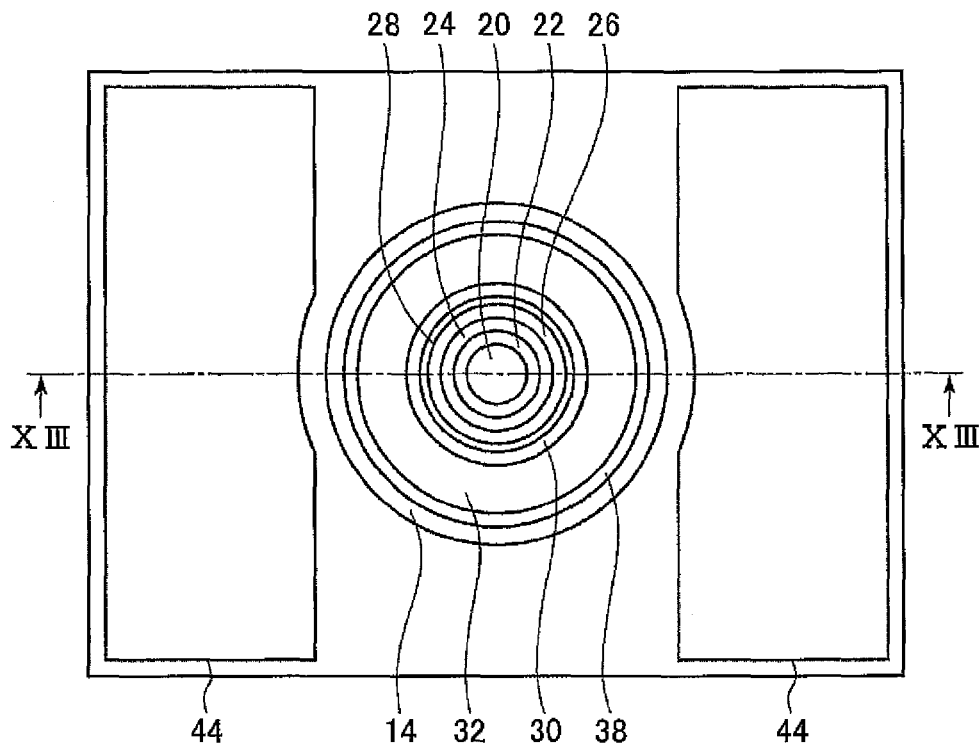
FIGS. 13A and 13B are a plan view and a schematic cross-sectional view illustrating a structure of a semiconductor photodetector element according to a fifth embodiment.
Figure 13B:
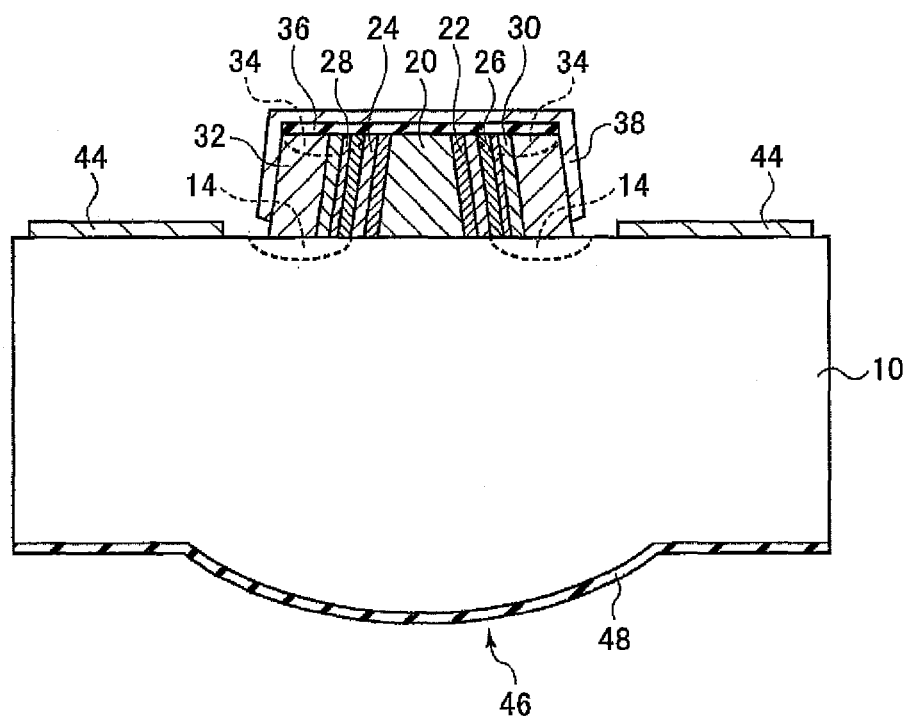
Figure 14:
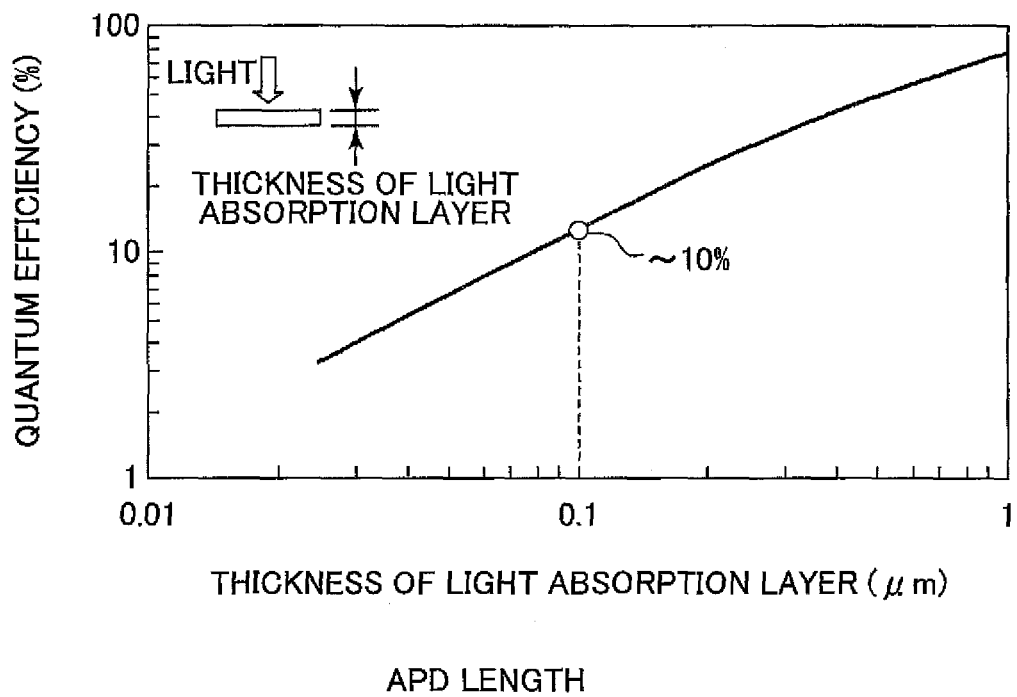
FIG. 14 is a graph illustrating a relationship between a thickness of a light absorption layer and quantum efficiency in a case where light is incident perpendicular to the surface of the light absorption layer.
Figure 15:
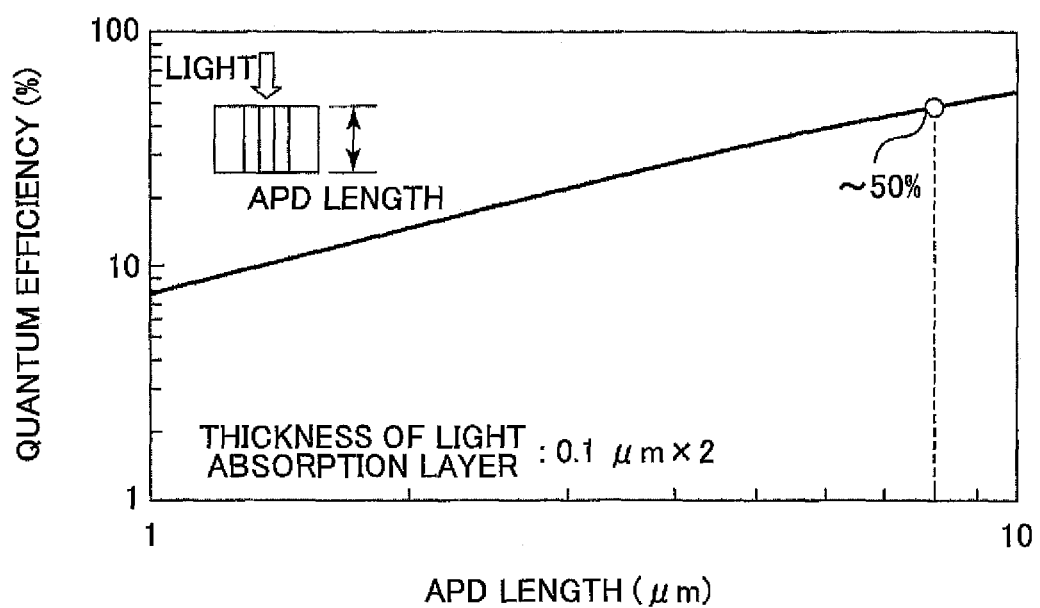
FIG. 15 is a graph illustrating a relationship between a thickness of a light absorption layer and quantum efficiency in a case where light is incident parallel to the surface of the light absorption layer.
Figure 16:
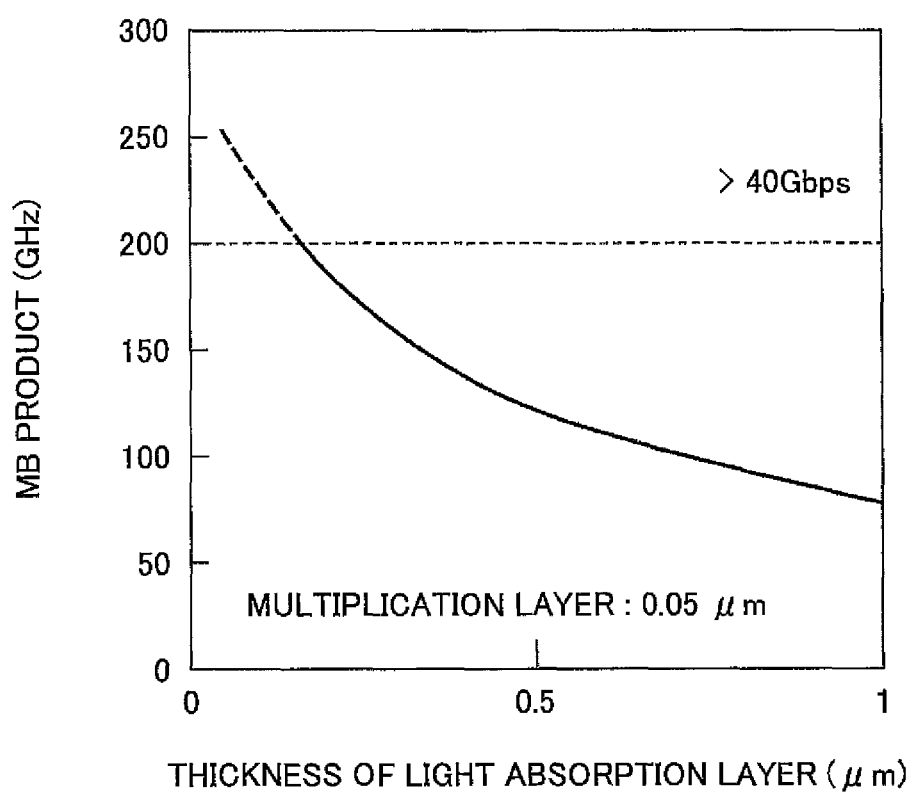
FIG. 16 is a graph illustrating a relationship between an MB product and the thickness of the light absorption layer.
Figure 20A:
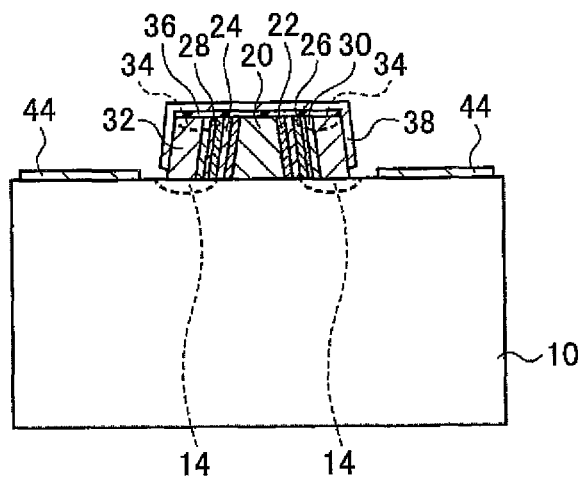
FIGS. 20A and 20B are process cross-sectional views illustrating a method of fabricating the semiconductor photodetector element according to the fifth embodiment.
Figure 20B:
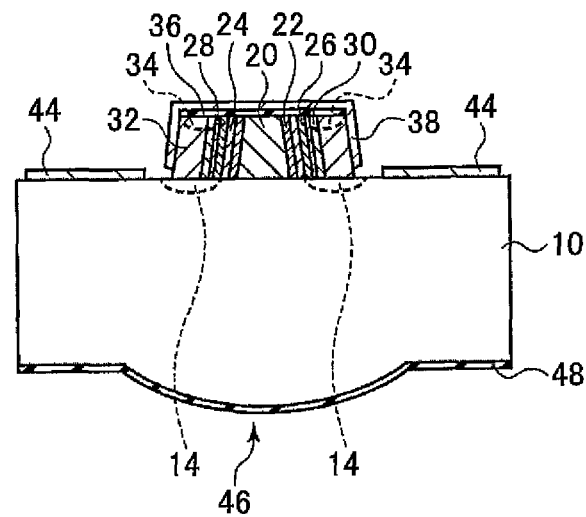
Figure 21:
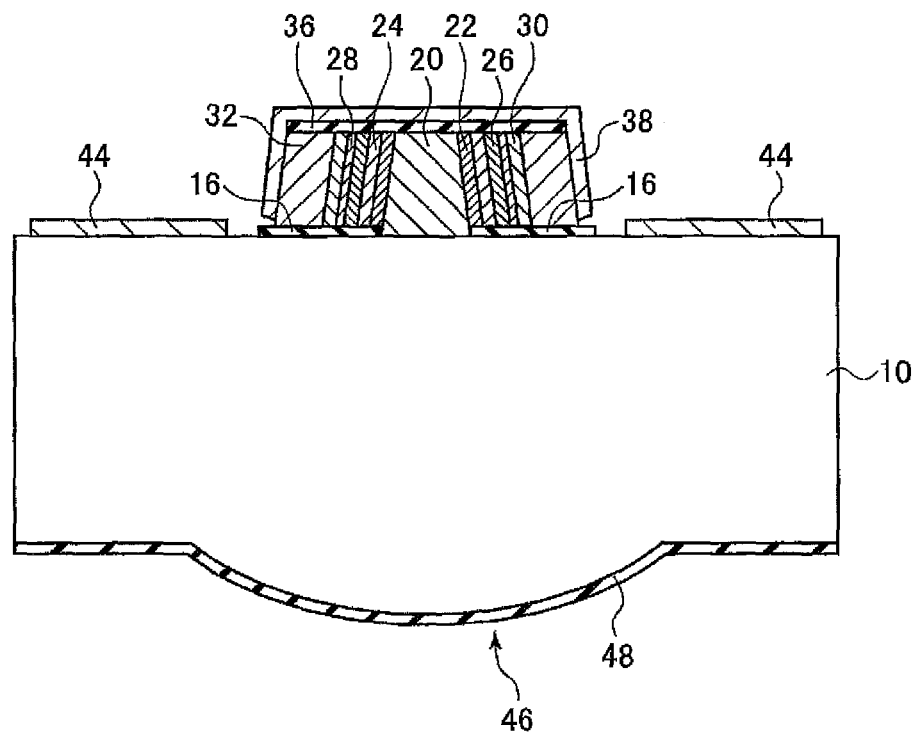
FIG. 21 is a schematic cross-sectional view illustrating a modification of the semiconductor photodetector element according to the fifth embodiment.
Figure 22:
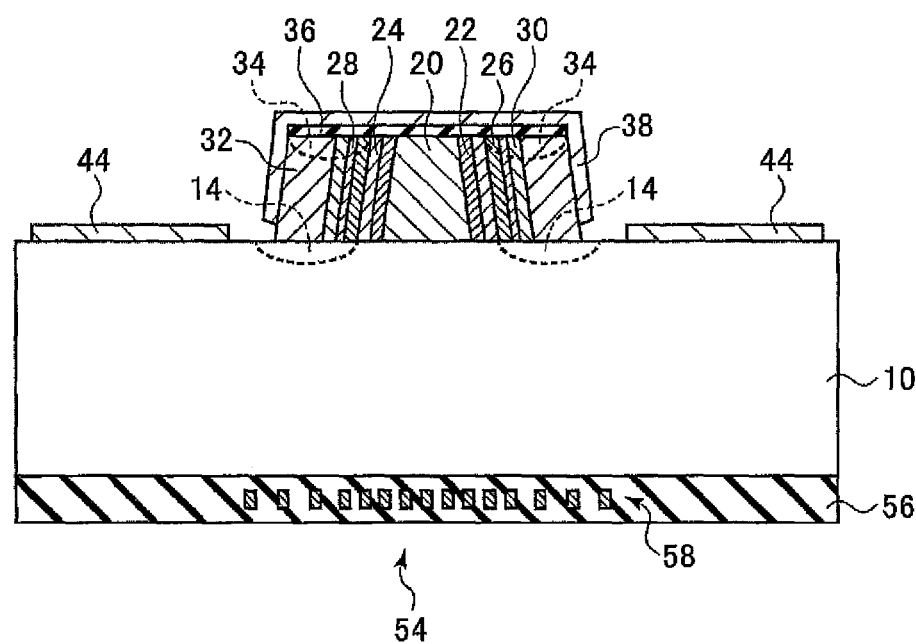
FIG. 22 is a schematic cross-sectional view illustrating a modification of the semiconductor photodetector element according to the fifth embodiment.

FIGS. 13A and 13B are a plan view and a schematic cross-sectional view illustrating a structure of a semiconductor photodetector element according to the fifth embodiment. FIG. 14 is a graph illustrating a relationship between the thickness of a light absorption layer and quantum efficiency in a case where light is incident perpendicular to the surface of the light absorption layer. FIG. 15 is a graph illustrating a relationship between the thickness of the light absorption layer and quantum efficiency in a case where light is incident parallel to the surface of the light absorption layer. FIG. 16 is a graph illustrating a relationship between an MB product and the thickness of the light absorption layer. FIGS. 17A to 20B are process cross-sectional views illustrating a method of fabricating the semiconductor photodetector element according to the fifth embodiment. FIGS. 21 and 22 are schematic cross-sectional views illustrating modification of the semiconductor photodetector element according to the fifth embodiment and the method of fabricating such a semiconductor photodetector element.

Initially, a description is given of a structure of the semiconductor photodetector element according to the fifth embodiment with reference to FIGS. 13A and 13B. FIG. 13A is a plan view of the semiconductor photodetector element according to the fifth embodiment, FIG. 13B is a cross-sectional view cut along a line XIII-XIII' of FIG. 13A.

A columnar structure 20 composed of a first conductivity type semiconductor is formed on a first conductivity type semiconductor substrate 10. An example of the first conductivity type semiconductor substrate 10 may include an n$^+$-InP substrate. The columnar structure 20 composed of the first conductivity type semiconductor may be composed of, but not specifically limited to, an n$^+$-InP.

A first conductivity type electrode 22 is formed on a side wall part of the columnar structure 20 such that the columnar structure 20 is surrounded by the first conductivity type electrode 22. The first conductivity type electrode 22 may be composed of, but not specifically limited to, an n$^+$-InP layer.

A light absorption layer 24 composed of an i-type semiconductor layer and configured to absorb light is formed on a side wall part of the semiconductor layer 22 such that the semiconductor layer 22 is surrounded by the light absorption layer 24A. The light absorption layer 24 may be composed of, but not specifically limited to, an i-InGaAs layer.

A graded layer 26 is formed on a side wall part of the light absorption layer 24 such that the light absorption layer 24 is surrounded by the graded layer 26. The graded layer 26 may be composed of, but not specifically limited to, an i-InGaAs layer. The graded layer 26 serves as a layer configured to interpolate energy band discontinuity between the light absorption layer 24 and a field drop layer 28. The graded layer 26 is, for example, a layer that changes gradually or stepwise from an InGaAs composition to an InP composition.

The field drop layer 28 is composed of a first conductivity type semiconductor layer configured to lower electric field intensity. The field drop layer 28 is formed on a side wall part of the graded layer 26 such that the graded layer 26 is surrounded by the field drop layer 28. The field drop layer 28 may be composed of, but not specifically limited to, an $n^+$-InP layer.

A carrier multiplication layer 30 is composed of an i-type semiconductor layer configured to cause avalanche amplification. The carrier multiplication layer 30 is formed on a side wall part of the field drop layer 28 such that the field drop layer 28 is surrounded by the carrier multiplication layer 30. The carrier multiplication layer 30 may be composed of, but not specifically limited to, an i-InP layer.

A second conductivity type (n-type or p-type) semiconductor layer 32 is formed on a side wall part of the carrier multiplication layer 30 such that the carrier multiplication layer 30 is surrounded by the second conductivity type semiconductor layer 32. The second conductivity type semiconductor layer 32 may be composed of, but not specifically limited to, a $p^+$-InP layer.

An insulating layer 36 is formed on upper end parts of the columnar structure 20, the semiconductor layer 22, the light absorption layer 24, the graded layer, the field drop layer 28, the carrier multiplication layer 30, and the semiconductor layer 32. A second conductivity type electrode 38 is formed on the insulating film 36 to extend along the side wall part of the semiconductor layer 32.

A guard ring 14 is formed in a boundary part within the semiconductor substrate 10 between the semiconductor substrate 10 and the light absorption layer 24, the graded layer, the field drop layer 28, the carrier multiplication layer 30 and the semiconductor layer 32. Further, a guard ring 34 is formed in boundary parts in the light absorption layer 24, the graded layer, the field drop layer 28, the carrier multiplication layer 30 and the semiconductor layer 32. The boundary parts are located between the insulating layer 36 and the light absorption layer 24, the graded layer, the field drop layer 28, the carrier multiplication layer 30 and the semiconductor layer 32. Note that the guard rings 14 and 34 are not necessarily formed; however, it is preferable to form the guard rings 14 and 34 in view of preventing edge-breakdown due to high electric field. An APD photodetector part is thus formed on a surface side of the semiconductor substrate 10 (i.e., an upper side in FIG. 13B). The first conductivity type electrode 44 is formed adjacent to the APD photodetector part on the surface of the semiconductor substrate 10.

A rear surface of the semiconductor substrate 10 (i.e., a lower side in FIG. 13B), which is an opposite side of the surface of the semiconductor substrate 10 on which the APD photodetector part is formed, is processed in a spherical shape to form a lens 46. A non-reflection film 48 is formed on the rear surface of the semiconductor substrate 10 forming the lens 46.

Hence, the semiconductor photodetector element according to the fifth embodiment is an APD type photodetector element having the APD photodetector part configured to detect light incident from the rear surface side of the semiconductor substrate 10. The light absorption layer 24 is disposed concentrically in a cylindrical configuration around the columnar structure 20, such that the columnar structure 20 is surrounded by the light absorption layer 24. Hence, a layered structure of the APD is also formed in a cylindrical configuration perpendicular to the semiconductor substrate 10.

The light subject to detection is incident from the rear surface side of the semiconductor substrate 10 (the lower side in FIG. 13B) is converged by the lens 46, and the converged light is incident into the APD photodetector part. Further, an application direction of electric fields applied to the layered structure of the APD via the first conductivity type electrode 44 and the second conductivity type electrode 38, namely, a carrier moving direction is a diameter direction of the cylinder forming the layered structure of the APD. That is, the incident direction of the light subject to detection and the application direction of the electric fields applied to the layered structure of the APD are orthogonal to each other.

In order to improve the high response characteristics of the photodetector element, the carrier traveling time may be reduced. Thus, it is preferable to decrease the thickness of the light absorption layer so as to shorten the carrier traveling time. On the other hand, in order to improve light absorption efficiency, it is preferable to increase the thickness of the light absorption layer to be greater than or equal to an optical absorption length.

In a generally-used structure of the photodetector element configured to receive light incident perpendicular to the pn junction surface, the above-described requirements are contradictory. For example, it may be difficult for the photodetector element for use in a high-rate system exhibiting a response rate of 10 Gbps or more to simultaneously implement high response characteristics and reasonable quantum efficiency.

Hence, in order to implement an APD exhibiting a response rate of 10 Gbps or more such as a 40-Gbps APD, the thickness of the light absorption layer may need to be further reduced for shortening the carrier traveling time. Hence, in the structure that receives light perpendicular to the pn junction surface, quantum efficiency merely decreases. Further, factors to restrict the response rate of the APD having a multiplication mechanism further includes multiplication time in the carrier multiplication layer in addition to the carrier traveling time. Hence, it may be desirable to design the MB product of the APD based on the consideration of the above-described factors.

A 40-Gpbs trunk network may require a 28 GHz bandwidth, that is, 70% of bit rates. In order to operate the network at the optimum multiplication factor of 7 times, a value of the MB product of 200 GHz or greater is required. However, there may exist no technology to stably implement to exhibit such a high MB product with high reproducibility in an InP carrier multiplication layer in the 10 -Gbps APO.

To further increase the rates by using InP materials in the multiplication layer, it may be necessary to further reduce the thicknesses of the light absorption layer and the multiplication layer. In addition, it may be necessary to maintain the value of the quantum efficiency.

Hence, the semiconductor photodetector element according to the fifth embodiment may be able to control light reception sensitivity in accordance with the thickness (the height) of the light absorption layer 24 along the incident direction of the light subject to detection, and to control high-rate response characteristics based on the thickness (the film thickness) of the light absorption layer 24 along the carrier moving direction. The height and film thickness of the light absorption layer 24 may be controlled independently. Hence, the light reception sensitivity and the high-rate response characteristics of the semiconductor photodetector element according to the fifth embodiment may be improved simultaneously.

Further, the second conductivity type electrode 38 formed on the insulating film 36 serves as a mirror with respect to incident light. Hence, the second conductivity type electrode 38 may provide an effect of reflecting the light that has not been absorbed by the light absorption layer 24 and has reached the second conductivity type electrode 38 to input such light into the light absorption layer 24 again. Accordingly, compared with the structure without the formation of the mirror, the structure of the fifth embodiment may be able to approximately halve the element length (the height of the columnar structure 20) for obtaining the same quantum efficiency.

FIG. 14 is a graph illustrating a result obtained by calculating a relationship between the thickness of the light absorption layer and the quantum efficiency in a case where light is incident perpendicular to the surface of the light absorption layer. FIG. 15 is a graph illustrating a result obtained by calculating a relationship between the thickness of the light absorption layer and the quantum efficiency in a case where light is incident parallel to the surface of the light absorption layer.

In a case where light is incident perpendicular to the surface of the light absorption layer, the quantum efficiency is low, being approximately 10% at the thickness of the light absorption layer being 0.1 µm, as illustrated in FIG. 14

On the other hand, in a case where light is incident along a central axis of the cylinder with respect to a cylindrical light absorption layer having a thickness of 0.1 µm, the quantum efficiency becomes approximately 50% by propagating the light 8 µm in length in a traveling direction of light to provide sufficient sensitivity, as illustrated in FIG. 15. In the structure having the mirror disposed on the light absorption layer, the element length may be halved. Hence, it is possible to implement 50% quantum effect with the element length of approximately 4 µm.

FIG. 16 is a graph illustrating a result obtained by calculating a relationship between the thickness of the light absorption layer and the MB product in a case where the thickness of the carrier multiplication layer is 0.05 µm and the element length is 4 µm.

As illustrated in FIG. 16, the MB product is made 200 GHz or greater by adjusting the thickness of the light absorption layer to approximately 0.15 µm or less. Hence, it is possible to satisfy the 40 Gbps specification value. It may be possible to implement the MB product of 2.5 times or more of that of the existing structure by utilizing the structure of the fifth embodiment.

Next, a description is given, with reference to FIGS. 17A to 20B, of the structure of the semiconductor photodetector element according to the embodiment. In this embodiment, the fabrication method is described on the basis of the example of the semiconductor photodetector element having the light absorption layer 24 composed of i-InGaAs. However, semiconductor photodetector elements composed of other materials may also be fabricated by a similar method.

Figure 17A:
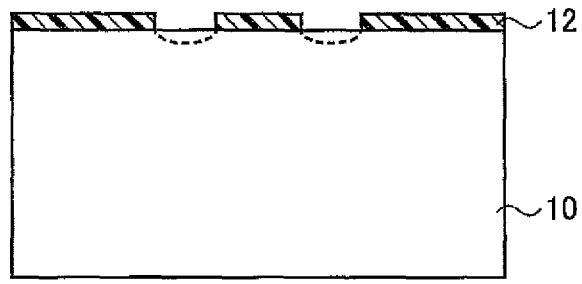
FIGS. 17A to 17C are process cross-sectional views illustrating a method of fabricating the semiconductor photodetector element according to the fifth embodiment.
Figure 17B:
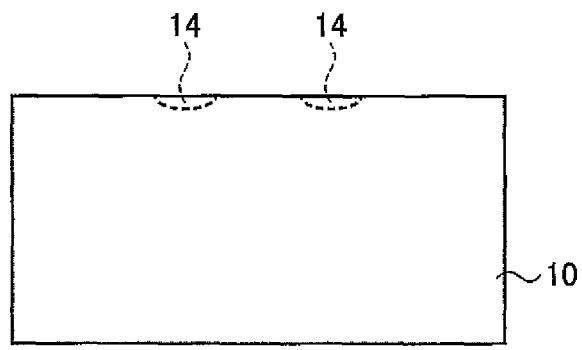
Figure 17C:
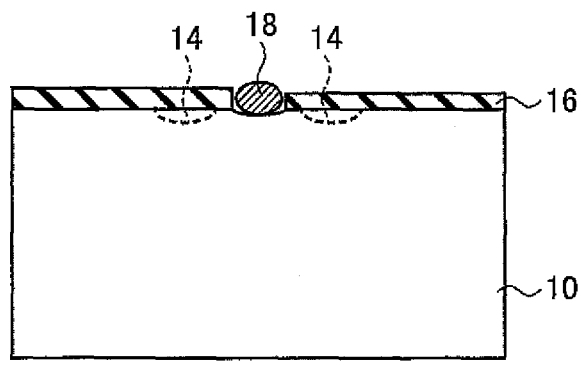

Initially, a mask film 12 composed of an insulating film such as a photoresist film or a silicon oxide film is formed on the semiconductor substrate 10. The semiconductor substrate 10 to be applied may be, but not specifically limited to, an n$^+$-InP substrate having a Si concentration of $1 \times 10^{18}$ cm$^{-3}$. Subsequently, the mask film 12 is patterned by photolithography to form an opening part in the mask film 12 so as to expose an expected guard ring 14 forming area. Then, beryllium (Be) ion implantation is performed by using the mask film 12 as a mask (FIG. 17A). Subsequently, after the removal of the mask film 12, the implanted beryllium is activated by a heat treatment under an inert gas atmosphere to form a guard ring 14 (FIG. 17B). Then, a silicon oxide film may be deposited by, for example, the CVD method to form an insulating film 16 composed of a silicon oxide film. Subsequently, the insulating film 16 is patterned by photolithography to remove the insulating film 16 in an expected columnar structure 20 forming area. Then, metallic microparticles 18 such as Au or the like are deposited in a part of the semiconductor substrate 10 exposed by removing the insulating film 16 (FIG. 17C).

For example, after a photoresist film is formed on the insulating film 16 for exposing the expected columnar structure 20 forming area, the insulating film 16 is removed by using the photoresist film as a mask. After the metallic microparticles 18 are deposited, the deposited metallic microparticles 18 are removed together with the photoresist film so as to cause the metallic microparticles 18 to selectively remain in the expected columnar structure 20 forming area.

Figure 18A:
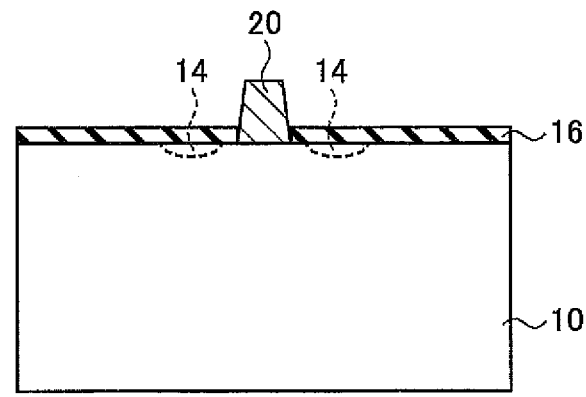
FIGS. 18A to 18C are process cross-sectional views illustrating a method of fabricating the semiconductor photodetector element according to the fifth embodiment.

Subsequently, a columnar structure 20 having a length of 4 µm is formed, for example, by the MOVPE method in an area of the semiconductor substrate 10 not covered with the insulating film 16 using the metallic particles 18 as catalyst. The columnar structure 20 may be composed of, but not specifically limited to, an n$^+$-InP having a Si concentration of $1 \times 10^{18}$ cm$^{-3}$. Note that in this embodiment, the columnar structure 20 formed has a circular truncated cone shape; however, the columnar structure 20 may have a cylindrical shape similar to the first embodiment. Subsequently, the metallic microparticles 18 remaining in an apex part of the columnar structure 20 are removed (FIG. 18A). Subsequently, the insulating film 16 is patterned by photolithography to remove the insulating film 16 in a peripheral part of the columnar structure 20.

Figure 18B:
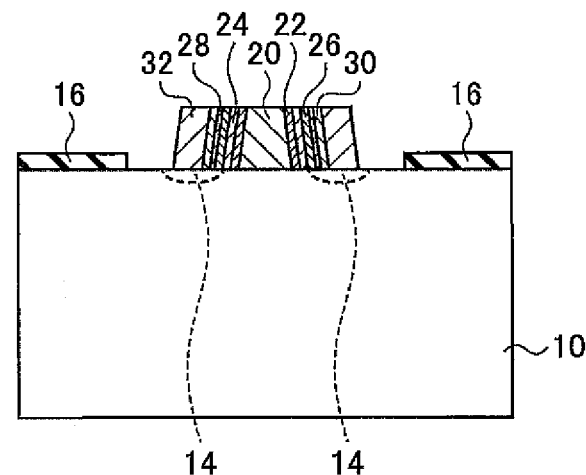

Then, the semiconductor layer 22, the light absorption layer 24, the graded layer 26, the field drop layer 28, the carrier multiplication layer 30, and the semiconductor layer 32 area are sequentially formed, for example, by the MOVPE method on a side part of the columnar structure 20 to form an APD (FIG. 18B).

The semiconductor layer 22 may be composed of, but not specifically limited to, an n$^+$-InP layer having a Si concentration of $1 \times 10^{18}$ cm$^{-3}$. The light absorption layer 24 may be composed of, but not specifically limited to, an i-InGaAs layer having a thickness of 0.1 µm. The graded layer 26 may be composed of, but not specifically limited to, an i-InGaAs layer. The field drop layer 28 may be composed of, but not specifically limited to, an n$^+$-InP layer having a Si concentration of $1 \times 10^{18}$ cm$^{-3}$. The carrier multiplication layer 30 may be composed of, but not specifically limited to, an i-InP layer having a thickness of 50 nm. The semiconductor layer 32 may be composed of, but not specifically limited to, a p$^+$-InP layer having a Zn concentration of $1\times10^{18}$ cm$^{-3}$. Subsequently, the insulating film 16 is removed by, for example, wet etching.

Figure 18C:
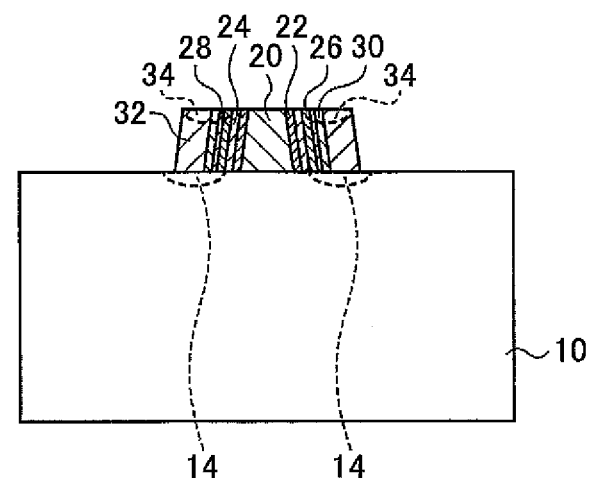
Figure 19A:
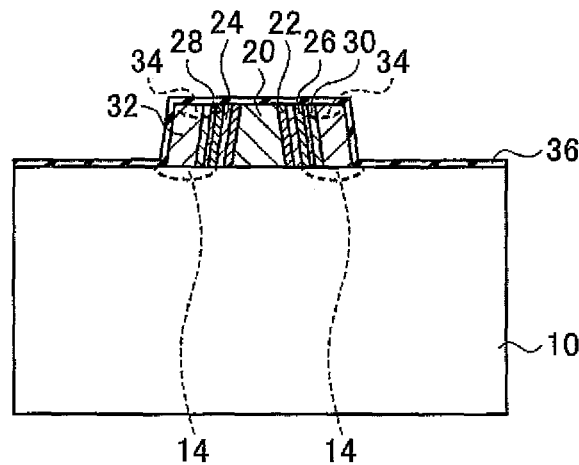
FIGS. 19A to 19C are process cross-sectional views illustrating a method of fabricating the semiconductor photodetector element according to the fifth embodiment.
Figure 19B:
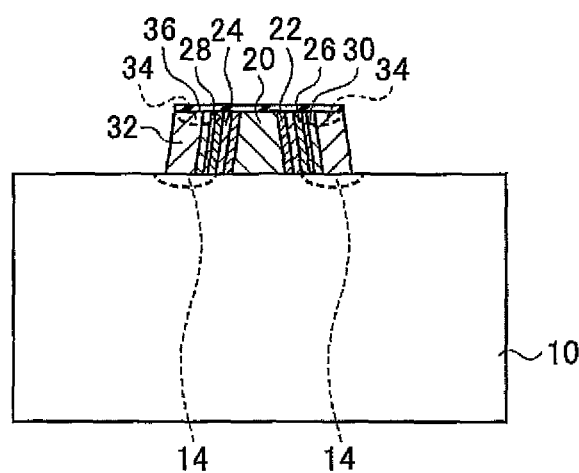

Note that the insulating film 16 residing in the peripheral part of the columnar structure 20 is not necessarily removed in a step prior to the formation of the layered structure of the APD photodetector part. In this case, the layered structure of the APD photodetector part is formed on the insulating film 16 similar to the cases of the first to the third embodiments (see FIG. 21). Subsequently, beryllium (Be) ion implantation is performed by using a not-illustrated photoresist for exposing the APD photodetector. Then, after the removal of the photoresist film, the implanted beryllium is activated by a heat treatment under an inert gas atmosphere to form a guard ring 34 (FIG. 18C). Subsequently, a silicon oxide film may be deposited by, for example, the CVD method to form an insulating film 36 composed of a silicon oxide film (FIG. 19A). Then, the insulating film 36 is patterned by photolithography to remove the insulating film 36 excluding that on an upper part of the APD photodetector part (FIG. 19B).

Figure 19C:
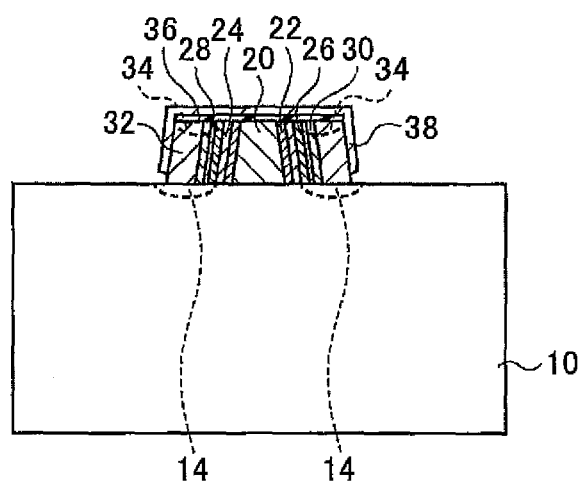

Subsequently, an Au film may be deposited by, for example, a vapor deposition method to form a p-type electrode 38 having a function of a mirror from the upper part to a side part of the of the APD photodetector part (FIG. 19C). At this time, since the insulating film 36 is formed on the upper surface of the APD photodetector part, the p-type electrode 38 is not alloyed to maintain high reflectance. Subsequently, an Au film is deposited by, for example, the vapor deposition method to form an n-type electrode 44 in the peripheral part of the APD photodetector part on the semiconductor substrate 10 (FIG. 20A).

Then, after the formation of a photoresist film on a rear surface of the semiconductor substrate 10, the shape of the photoresist film is adjusted by utilizing surface tension, and ion milling etching is carried out. The shape of the photoresist film is transferred onto the semiconductor substrate 10 to form a lens 46 on the rear surface of the semiconductor substrate 10.

Note that as illustrated in FIG. 22, a high-index contrast grating (HCG) 54 may be formed on the rear surface of the semiconductor substrate 10 instead of forming the lens 46 on the rear surface of the semiconductor substrate 10. The high-index contrast grating 54 may, for example, be formed of an amorphous silicon pattern 58 embedded inside the silicon oxide film 56. For example, the high-index contrast grating 54 is formed by depositing a silicon oxide film and an amorphous silicon film on the rear surface of the semiconductor substrate 10, processing the amorphous silicon film into a grating pattern, and then further depositing a silicon oxide film. Subsequently, a non-reflection film 48 is formed on the rear surface of the semiconductor substrate 10 forming the lens 46 to complete a semiconductor photodetector element according to the embodiments.

As described above, according to the embodiment, since the APD structure is formed in a cylindrical shape to surround the columnar structure perpendicular to the semiconductor substrate, light reception sensitivity and high-rate response characteristics may simultaneously be improved. In addition, the photodetector element may be reduced in size.

Sixth Embodiment

Figure 23:
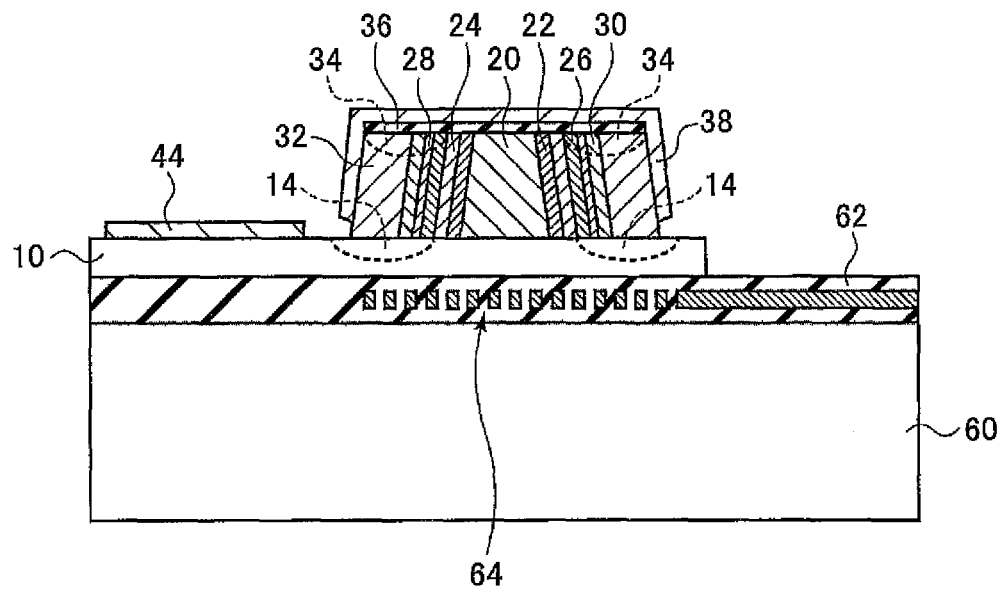
FIG. 23 is a schematic cross-sectional view illustrating a structure of a semiconductor photodetector element according to a sixth embodiment.
Figure 24:
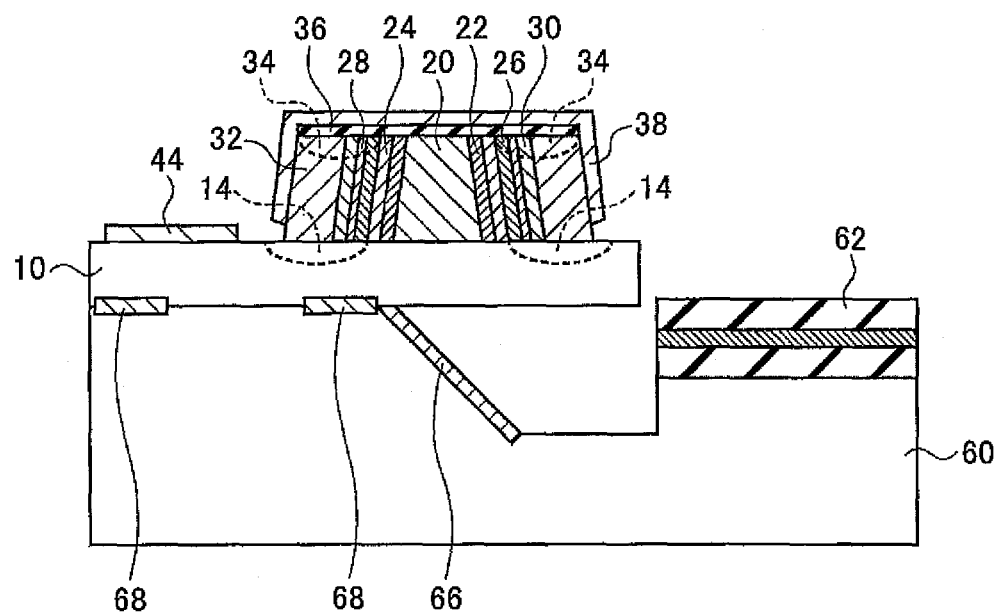
FIG. 24 is a schematic cross-sectional view illustrating a structure of the semiconductor photodetector element according to the sixth embodiment.

A description is given, with reference to FIGS. 23 and 24, of a semiconductor photodetector element according to a sixth embodiment, and a method of fabricating such a semiconductor photodetector element. In FIGS. 23 and 24, components similar to those of the semiconductor photodetector element according to the first embodiment to the fourth embodiment illustrated in FIGS. 1A to 21 are provided with the same reference numbers to simplify the description by omitting duplicated illustration. FIGS. 23 and 24 are schematic cross-sectional views illustrating a structure of the semiconductor photodetector element according to the sixth embodiment. The sixth embodiment describes an example of a semiconductor photodetector element that integrates the semiconductor photodetector element according to the fifth embodiment and an optical waveguide.

FIG. 23 describes a structure of the sixth embodiment in which an optical waveguide 62 and a high index contrast grating 64 are formed on a surface of a semiconductor substrate 60, and the semiconductor photodetector element according to the fifth embodiment is formed on such a substrate 60. In this structure, an optical path of light incident from the optical waveguide 62 may be converted by the high-index contrast grating 54 so as to lead the incident light to the APD photodetector part.

For example, the optical waveguide 62 and a high index contrast grating 64 are formed and then planarized on the surface of the silicon substrate 60 in a method similar to the fabrication method of the aforementioned high index contrast grating 54. Then, after a silicon substrate 10 is adhered to the planarized optical waveguide 62 and high index contrast grating 64, and the obtained product is polished to have the thickness of 20 µm, an APD photodetector part may be formed in a manner similar to the fabrication method of the semiconductor photodetector element according to the fifth embodiment.

FIG. 24 describes a structure of the sixth embodiment in which an optical waveguide 62 and a mirror 66 formed on a surface of a semiconductor substrate 60, and the semiconductor photodetector element according to the fifth embodiment is formed on such a substrate 60. In this structure, light incident from the optical waveguide 62 may be reflected by the mirror 66 so as to lead the incident light to the APD photodetector part.

For example, after a part forming the optical waveguide 62 of the semiconductor substrate 60 is removed by etching, the optical waveguide 62 is formed by a method similar to the fabrication of the high index contrast grating 54. Thereafter, a light emitting end of the optical waveguide 62 is etched perpendicularly so as to simultaneously remove unnecessary parts. An inclined reflecting mirror is formed by an ICP etching or the like, and a metallic film is formed on the reflecting mirror, thereby forming the mirror 66. In the separately fabricated semiconductor photodetector element, a rear surface of the semiconductor substrate 10 is polished. AuSn is deposited on the surface and the rear surface of the semiconductor substrate 60 to form, for example, pad parts 68, which are aligned by an alignment method utilizing infrared radiation to be flipchip bonded with each other. As described above, according to the sixth embodiment, it may be possible to introduce light into the APD photodetector part with high efficiency so as to improve detection efficiency.

Seventh Embodiment

A description is given, with reference to FIGS. 25 to 29B, of a semiconductor photodetector element according to a seventh embodiment, and a method of fabricating the semiconductor photodetector element. In FIGS. 25 to 29B, components similar to those of the semiconductor photodetector element according to the first embodiment to the sixth embodiment illustrated in FIGS. 1A to 24 are provided with the same reference numbers to simplify the description by omitting duplicated illustration.

Figure 25:
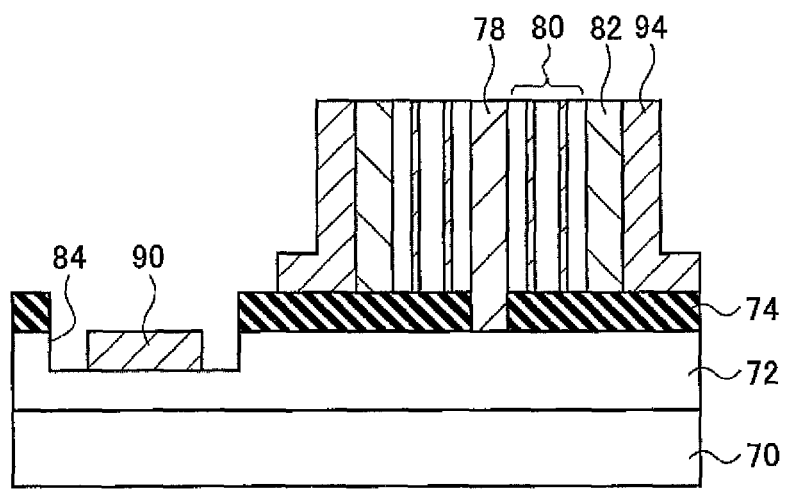
FIG. 25 is a schematic cross-sectional view illustrating a structure of a semiconductor photodetector element according to a seventh embodiment.

FIG. 25 is a schematic cross-sectional view illustrating a structure of a semiconductor photodetector element according to the sixth embodiment. FIGS. 16A to 293 are process cross-sectional views illustrating a method of fabricating the semiconductor photodetector element according to the seventh embodiment. Initially, a description is given of a structure of the semiconductor photodetector element according to the seventh embodiment with reference to FIG. 25.

An n-GaAs layer 72 is formed on a semi-insulating GaAs substrate 70. An n-GaAs columnar structure 78 is formed on the n-GaAs layer 72. An insulator film 74 is formed in a part of an area of the n-GaAs layer 72 excluding a part of the area in which the n-GaAs columnar structure 78 is formed. An active layers 80 having a multiple quantum well structure and serving as the light absorption layer is formed on a side wall part of the n-GaAs columnar structure 78 so as to surround a periphery of the n-GaAs columnar structure 78. The multiple quantum well structure of the active layer 80 is formed in layers in a concentric cylindrical direction around the n-GaAs columnar structure 78 serving as an axis. An n-GaAs layer 82 is formed on a side wall part of the active layer 80 so as to surround the active layer 80. An electrode 94 is formed on a side wall part of the n-GaAs layer 82 so as to surround the n-GaAs layer 82. An opening part 84 reaching the n-GaAs layer 72 is formed in an area of the insulating film 74 away from an area of the insulating film 74 on which the electrode 84 is formed.

As described above, the semiconductor photodetector element according to the seventh embodiment includes the active layer 80 having the multiple quantum well structure that is disposed on the side wall part of the n-GaAs columnar structure 78 formed perpendicular to the surface of the semi-insulating GaAs substrate 70 so as to surround the periphery of the n-GaAs columnar structure 78. That is, a layered direction of the multiple quantum well structure of the active layer 80 is a direction intersecting the surface of the semi-insulating GaAs substrate 70, typically, a direction perpendicular to the surface of the semi-insulating GaAs substrate 70. The semiconductor photodetector element according to the seventh embodiment may, but not specifically limited to, be a photodetector element for use in the detection of infrared radiation, for example.

A quantum-well infrared sensor may include a semiconductor layer (active layer) that is active to infrared radiation, and two electrodes formed one on each end of the semiconductor layer. The active layer has a quantum-well structure, and carriers are constrained by a bound level of the quantum-well structure. When the infrared sensor receives incident light, carriers constrained in the well absorb infrared radiation to be excited and transition between sub-bands. As a result, the carriers are released from the constraint of the bound level of the quantum-well structure. The carriers excited by the application of voltage between the electrodes are converged on the electrodes to form photocurrent. The infrared sensor may be able to detect infrared radiation by measuring the amount of current flowing in the infrared sensor.

In general, an infrared imaging apparatus includes infrared sensor elements disposed in a two-dimensional array. The two-dimensional array of the infrared sensor elements may be formed by growing element crystal on the semiconductor substrate, and performing pixel separation on the obtained product. In this structure of the quantum-well infrared sensor, since a quantum-well layer is formed parallel to the surface of the substrate, the pixel arrangement is parallel to the quantum-well layer. Accordingly, the quantum-well infrared sensor is used in a condition in which infrared radiation is incident perpendicular to the quantum-well layer.

In order for the carriers constrained in the quantum well to absorb incident infrared radiation to transition between sub-bands, the incident infrared radiation needs to include an electric field component perpendicular to the quantum well. Since the infrared radiation has an electric field component perpendicular to a traveling direction of the infrared radiation, the infrared radiation incident perpendicular to the quantum well layer is not absorbed in the active layer. Hence, a generally-used quantum sensor is provided with a diffraction grating for changing the traveling direction of the infrared radiation.

However, an appropriate structure of the grating varies with a desired one of wavelengths of the infrared radiation. In order to produce an infrared sensor configured to handle different wavelengths, a diffraction grating needs to be designed for each of the different wavelengths. Further, the probability of light absorption may fluctuate with an angle of infrared radiation diffracted by the diffraction grating. Hence, the diffraction grating may further need to be designed based on consideration of diffraction angles of the infrared radiation.

By contrast, in the semiconductor photodetector element according to the seventh embodiment, a layered direction of the multiple quantum well structure of the active layer 80 is a direction intersecting the surface of the semi-insulating GaAs substrate 70, typically, a direction perpendicular to the surface of the semi-insulating GaAs substrate 70. Hence, the infrared radiation incident perpendicular to the semi-insulating GaAs substrate 70 has an electric field component perpendicular to the quantum well layer. Hence, when infrared radiation subject to detection is incident from a rear surface of the semi-insulating GaAs substrate 70 (a lower side of in FIG. 25), the incident infrared radiation is absorbed by the active layer 80, and absorbed infrared radiation may be detected as the current flowing between the electrodes 90 and 94.

Accordingly, the semiconductor photodetector element according to the seventh embodiment does not require a diffraction grating configured to change the traveling direction of the infrared radiation subject to detection, and hence, a step of forming the diffraction grating may be omitted from the fabrication process. In addition, there is no need of designing a diffraction grating for each of the wavelengths of the infrared radiation subject to detection, and hence, man power for designing the diffraction grating may be omitted. Accordingly, the fabrication cost of the semiconductor photodetector element may be significantly reduced.

Next, a description is given, with reference to FIGS. 26A to 29B, of a method of fabricating a semiconductor photodetector element according to the seventh embodiment.

Figure 26A:
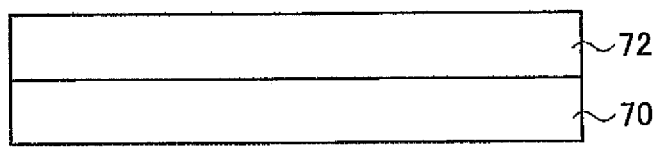
FIGS. 26A to 26C are process cross-sectional views illustrating a method of fabricating the semiconductor photodetector element according to the seventh embodiment.
Figure 26B:
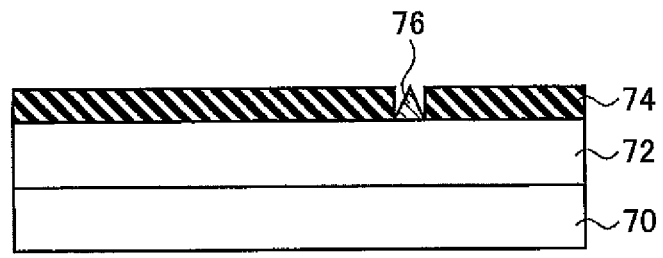

Initially, an n-GaAs layer 72 having a thickness of 500 nm may, for example, be grown on the semi-insulating GaAs substrate 70, for example, by the MOVPE method (FIG. 26A). Examples of raw materials of GaAs include triethylgallium (TEGa), and arsine ($AsH_3$). An example of an n-type dopant may include sulfur (S), and a raw material of sulfur may include hydrogen sulfide ($H_2S$). The impurity concentration may, for example, be in a range from $5 \times 10^{17}$ $cm^{-3}$ to $\times 10^{19}$ $cm^{-3}$. Then, a silicon oxide film may be deposited on the n-GaAs layer 72, for example, by the CVD method to form an insulating film 74 composed of a silicon oxide film. Subsequently, the insulating film 74 is patterned by photolithography to remove the insulating film 74 in an expected n-GaAs columnar structure 78 forming area. Then, metallic microparticles 76 such as Au or the like are deposited in a part of the n-GaAs layer 72 exposed by removing the insulating film 74 from the n-GaAs layer 72 (FIG. 26B).

For example, after the formation of a photoresist film on the insulating film 74 for exposing the expected n-GaAs columnar structure 78 forming area, the insulating film 74 is removed by using the photoresist film as a mask. After the metallic microparticles 76 are deposited, the deposited metallic microparticles 76 are removed together with the photoresist film so as to cause the metallic microparticles 76 to selectively remain in the expected n-GaAs columnar structure 78 forming area.

Figure 26C:
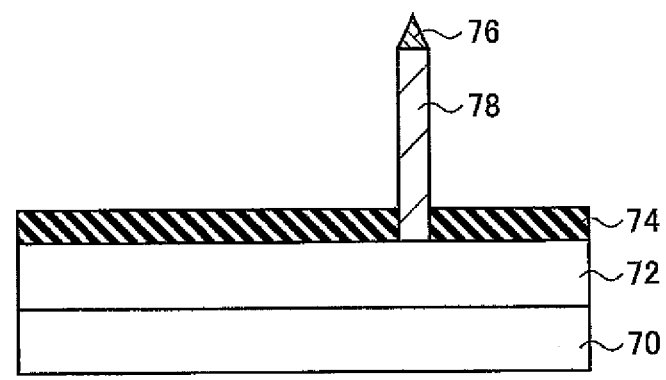

Subsequently, an n-GaAs columnar structure 78 having a length of 4 μm is formed in an area of the n-GaAs layer 72 not covered with the insulating film 74, for example, by the MOVPE method using the metallic particles 76 as catalyst (FIG. 26C). A growth temperature of the n-GaAs columnar structure 78 may, for example, be 450° C. Subsequently, the metallic microparticles 76 are removed by a generally-used etching technology.

Figure 27A:
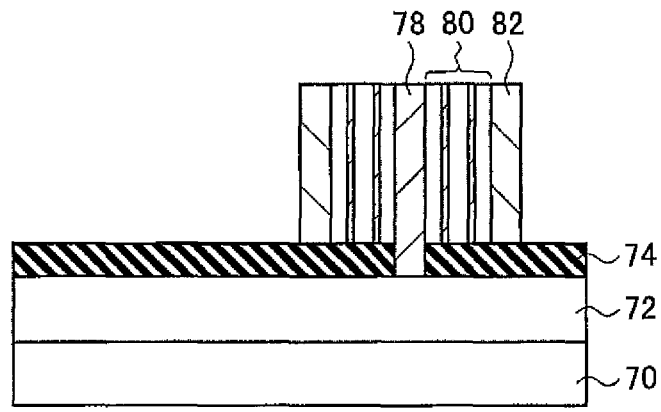
FIGS. 27A to 27C are process cross-sectional views illustrating a method of fabricating the semiconductor photodetector element according to the seventh embodiment.

Then, an active layer 80 having a multiple quantum well structure and an n-GaAs layer 82 having a thickness of, for example, 200 nm are grown on the side part of the n-GaAs columnar structure 78, for example, by the MOVPE method (FIG. 27A).

Figure 27B:
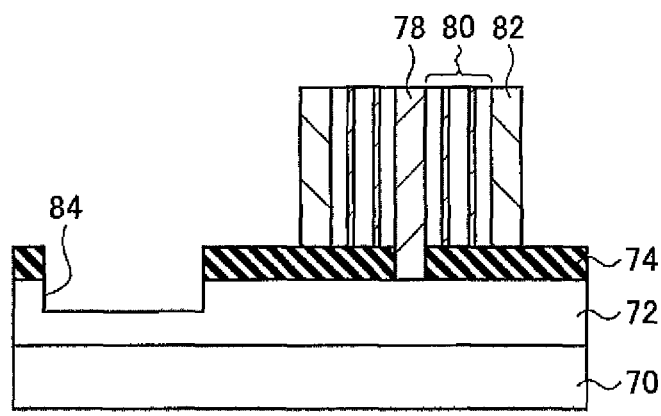
Figure 27C:
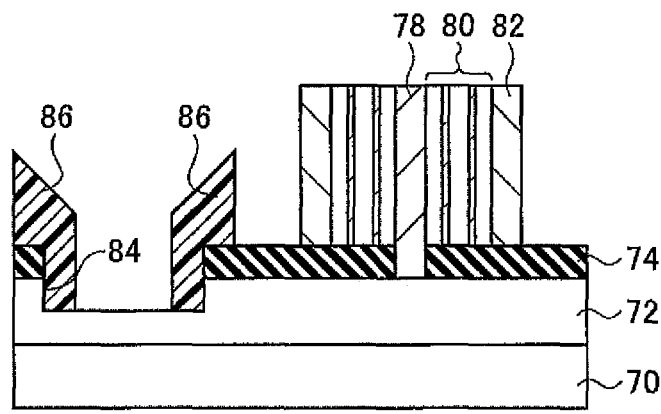

The active layer 80 may be formed as follows. For example, after an $Al_{0.3}Ga_{0.7}As$ barrier layer having a thickness of 30 nm and a $In_{0.3}Ga_{0.7}As$ well layer having a thickness of 2.5 nm are repeatedly formed ten times, an $Al_{0.3}Ga_{0.7}As$ barrier layer is further formed. The growth condition may include the growth temperature of 500° C., TEGa used as a raw material of Ga, triethylaluminium (TEAl) used as a raw material of Al, arsine used as a raw material of As, and trimethylindium (TMIn) used as a raw material of indium. The impurity concentration of the n-GaAs layer 82 may, for example, be in a range from $5 \times 10^{17}$ $cm^{-3}$ to $1 \times 10^{19}$ $cm^{-3}$. Subsequently, an opening part 84 reaching the n-GaAs layer 72 is formed in an expected electrodes 90 and 94 forming area by photolithography and etching (FIG. 27B). Then, a photoresist film 86 covering a separation area separating the electrode 90 from the electrode 94 is formed by photolithography (FIG. 27C).

Figure 28A:
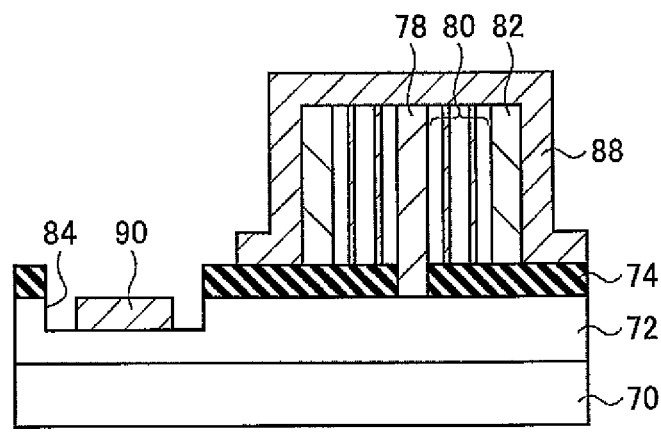
FIGS. 28A and 28B are process cross-sectional views illustrating a method of fabricating the semiconductor photodetector element according to the seventh embodiment.
Figure 28B:
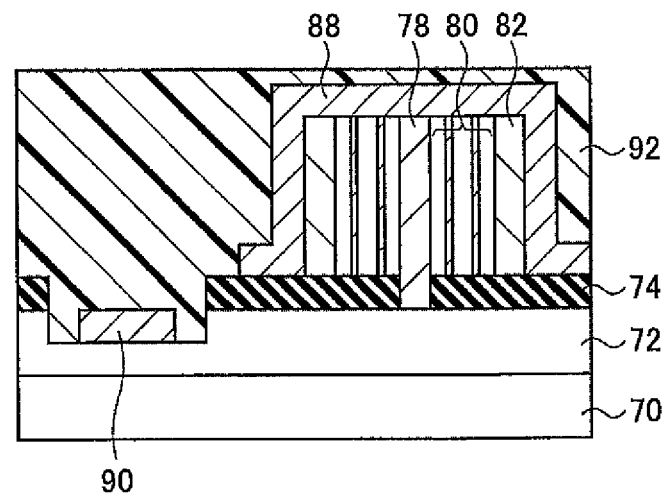

Subsequently, after the deposition of a metallic film 88 to later serve as the electrodes 90 and 94, an unnecessary part of the metallic film 88 is removed together with the photoresist film 86. The electrode 90 composed of the metallic film 88 is thus formed within the opening part 84 (FIG. 28A). Subsequently, a resist film 92 is applied over an entire surface of the product of FIG. 28A (FIG. 28B).

Figure 29A:
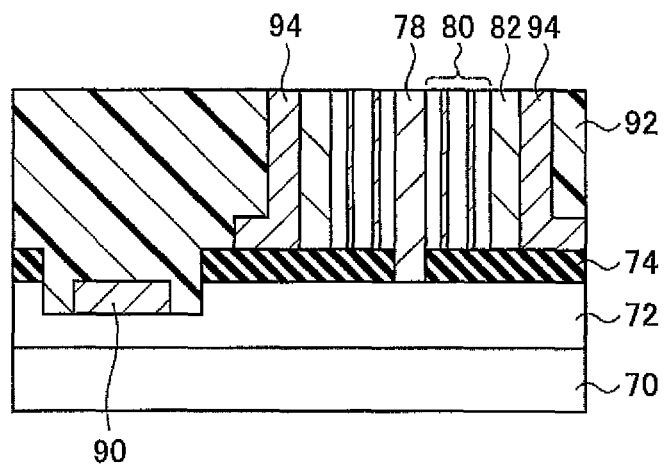
FIGS. 29A and 29B are process cross-sectional views illustrating a method of fabricating the semiconductor photodetector element according to the seventh embodiment.
Figure 29B:
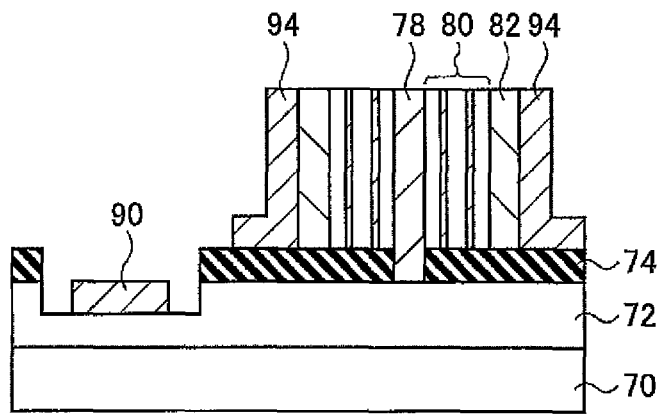

Subsequently, the resist film 92 and the metallic film 88 on the n-GaAs columnar structure 78, the active layer 80, and the n-GaAs layer 82 are removed by a generally-used etching technology. The electrode 84 composed of the metallic film 88 formed on a side wall part of the n-GaAs layer 82 is thus formed (FIG. 29A).
Subsequently, the resist film 92 is removed to complete the semiconductor photodetector element according to the seventh embodiment (FIG. 29B).

As described above, in the semiconductor photodetector element according to the seventh embodiment, since the multiple quantum well structure is formed to surround the columnar structure perpendicular to the semiconductor substrate, infrared radiation may be detected with high sensitivity without changing the incident direction of the infrared radiation.

Modification

The invention is not limited to the above-described embodiments, and various modification may be made.

For example, in the avalanche photodiode (APD) type semiconductor photodetector element illustrated in the third embodiment, the columnar structure 20 may have a circular truncated cone shape similar to the semiconductor photodetector element according to the second embodiment.

Further, in the fourth embodiment, the two-dimensional photodetector element array is formed by using the photodetector elements according to the first embodiment. However, the two-dimensional photodetector element array may be formed by using the photodetector element according to the second embodiment or the third embodiment. In addition, the two-dimensional photodetector element array may be formed by disposing the photodetector elements according to the fifth embodiment to the seventh embodiment in an array configuration.

Further, the layered structure of the APD photodetector part of the semiconductor photodetector element according to the fifth embodiment may be applied to the semiconductor photodetector element according to the third embodiment. The guard rings 14 and 34 may further be provided.

Moreover, the semiconductor photodetector element according to the seventh embodiment includes the cylindrical columnar structure 78. However, the semiconductor photodetector element according to the seventh embodiment may include a circular truncated cone columnar structure similar to the semiconductor photodetector element according to the second embodiment or the fifth embodiment. Further, the seventh embodiment describes the semiconductor photodetector element that includes the active layer 80 having the multiple quantum well structure. However, the semiconductor photodetector element according to the seventh embodiment is not necessarily provided with two or more quantum well layers.

Moreover, the structure, the configuration materials, the fabrication conditions, and the like of the semiconductor photodetector element described above are merely examples, and may be appropriately altered or modified based on the common technical knowledge of those skilled in the art.

According to the disclosed embodiments of the semiconductor photodetector element and the fabrication method, since the light absorption layer is disposed in a cylindrical shape such that the light absorption layer surrounds the columnar structure formed on the semiconductor substrate, it may be possible to implement the improvement of the light reception sensitivity and the high-rate response simultaneously. In addition, it may be possible to reduce the photodetector element in size.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the first embodiments of the present invention have been described in detail, it should be understood that the various changes, substitutions, and alterations could be made hereto without departing from the spirit and scope of the invention.

What is claimed is:

1. A semiconductor photodetector element comprising:
a semiconductor substrate having a first conductivity type;
a columnar structure formed on a first surface of the semiconductor substrate, the columnar structure being composed of a semiconductor of the first conductivity type;
a light absorption layer formed so as to surround the columnar structure;
a semiconductor layer formed so as to surround the light absorption layer;
a carrier multiplication layer formed between the light absorption layer and the semiconductor layer;
a graded layer and a field drop layer formed between the light absorption layer and the carrier multiplication layer,
a first electrode configured to electrically connected to the semiconductor substrate;
a second electrode configured to electrically connected to the semiconductor layer; and
an insulating layer formed on upper surfaces of the columnar structure, the light absorption layer, the graded layer, the field drop layer, the carrier multiplication layer, and the semiconductor layer,
wherein the second electrode extends on the insulating layer and along a side surface of the semiconductor layer, and
wherein a surface of the second electrode is in contact with the insulating layer and serves as a mirror.

2. The semiconductor photodetector element as claimed in claim 1, further comprising:
a semiconductor area having a second conductivity type formed on respective upper surfaces of the field drop layer, the carrier multiplication layer, and the semiconductor layer, the second conductivity type being a conductivity type reverse to the first conductivity type.

3. The semiconductor photodetector element as claimed in claim 1, wherein
the semiconductor layer includes a second conductivity type reverse to the first conductivity type.

4. The semiconductor photodetector element as claimed in claim 1, further comprising:
a converging part formed on a second surface of the semiconductor substrate, the converging part being configured to converge light incident in the light absorption layer.

5. The semiconductor photodetector element as claimed in claim 1, further comprising:
an optical waveguide disposed on a second surface of the semiconductor substrate; and
an optical path converter configured to convert an optical path of light output from the optical waveguide so as to input the light in the light absorption layer.

6. The semiconductor photodetector element as claimed in claim 1, wherein
when r0 denotes a radius of the columnar structure, r1 denotes a radius of an outer periphery of the light absorption layer, and a denotes an optical absorption coefficient, a relationship represented by $r1/r0 > \exp(a/2 \times 10^4)$ is satisfied.

7. The semiconductor photodetector element as claimed in claim 1, wherein
the semiconductor layer includes the first conductivity type.

8. The semiconductor photodetector element as claimed in claim 1, wherein the light absorption layer is an indirect band gap semiconductor and includes a quantum well layer formed so as to surround the columnar structure.

9. A method of fabricating a semiconductor photodetector element, the method comprising:
forming a columnar structure on a semiconductor substrate having a first conductivity type, the columnar structure being composed of a semiconductor of the first conductivity type;
forming a light absorption layer so as to surround the columnar structure;
forming a semiconductor layer so as to surround the light absorption layer;
forming a carrier multiplication layer after the forming of the light absorption layer, and before the forming of the semiconductor layer, the carrier multiplication layer being formed so as to surround the light absorption layer;
forming a graded layer before the forming of the carrier multiplication layer, and after the forming of the light absorption layer, the graded layer being formed so as to surround the light absorption layer; and
forming a field drop layer so as to surround the graded layer,
forming a first electrode configured to electrically connected to the semiconductor substrate;
forming a second electrode configured to electrically connected to the semiconductor layer; and
forming an insulating layer formed on upper surfaces of the columnar structure, the light absorption layer, the graded layer, the field drop layer, the carrier multiplication layer, and the semiconductor layer,
wherein the second electrode extends on the insulating layer and along a side surface of the semiconductor layer, and
wherein a surface of the second electrode is in contact with the insulating layer and serves as a mirror.

10. The method as claimed in claim 9, wherein
the forming the light absorption layer includes forming a cylindrical quantum well layer so as to surround the columnar structure.

11. The method as claimed in claim 9, wherein the light absorption layer is an indirect band gap semiconductor and includes a quantum well layer formed so as to surround the columnar structure.

* * * * *